(12) United States Patent
Kuroda et al.

(10) Patent No.: US 7,226,660 B2
(45) Date of Patent: Jun. 5, 2007

(54) CONDUCTIVE FINE PARTICLES, METHOD FOR PLATING FINE PARTICLES, AND SUBSTRATE STRUCTURAL BODY

(75) Inventors: Hiroshi Kuroda, Shiga (JP); Nobuyuki Okinaga, Shiga (JP)

(73) Assignee: Sekisui Chemical Co., Ltd., Osaka (JP)

( * ) Notice: Subject to any disclaimer, the term of this patent is extended or adjusted under 35 U.S.C. 154(b) by 244 days.

(21) Appl. No.: 10/343,944

(22) PCT Filed: Apr. 27, 2001

(86) PCT No.: PCT/JP01/03743

§ 371 (c)(1),
(2), (4) Date: May 1, 2003

(87) PCT Pub. No.: WO02/13205

PCT Pub. Date: Feb. 14, 2002

(65) Prior Publication Data

US 2005/0260430 A1    Nov. 24, 2005

(30) Foreign Application Priority Data

| Aug. 4, 2000 | (JP) | ............................. 2000-237185 |
| Aug. 25, 2000 | (JP) | ............................. 2000-255931 |
| Aug. 25, 2000 | (JP) | ............................. 2000-255932 |
| Aug. 25, 2000 | (JP) | ............................. 2000-255933 |
| Aug. 25, 2000 | (JP) | ............................. 2000-255934 |

(51) Int. Cl.
*B32B 5/16* (2006.01)

(52) U.S. Cl. ....................................... 428/403; 428/570

(58) Field of Classification Search ................ 428/403, 428/327, 328, 570
See application file for complete search history.

(56) References Cited

U.S. PATENT DOCUMENTS 4,740,657 A * 4/1988 Tsukagoshi et al. ...... 174/88 R

| 5,486,941 A | 1/1996 | Saiuchi et al. |
| 5,614,320 A * | 3/1997 | Beane et al. ................. 428/403 |
| 6,344,156 B1 * | 2/2002 | Yamada et al. ............. 252/512 |
| 6,352,775 B1 * | 3/2002 | Sasaki et al. ................ 428/403 |

FOREIGN PATENT DOCUMENTS

| EP | 0 242 025 A1 | 2/1987 |
| JP | 61231066 | 10/1986 |
| JP | 6-77408 | 4/1988 |
| JP | 63231889 | 9/1988 |
| JP | 1-242782 | 9/1989 |
| JP | 4192212 | 7/1992 |
| JP | 5036306 | 2/1993 |
| JP | 6-503180 | 4/1994 |
| JP | 7068690 | 3/1995 |
| JP | 9-137289 | 5/1997 |
| JP | 9-198916 | 7/1997 |
| JP | 9185069 | 7/1997 |
| JP | 9204815 | 8/1997 |
| JP | 9306231 | 11/1997 |
| JP | 11124682 | 5/1999 |
| JP | 11-172495 | 6/1999 |
| JP | 11-265910 | 9/1999 |
| JP | 11256390 | 9/1999 |
| JP | 11-329059 | 11/1999 |
| JP | 11317416 | 11/1999 |
| JP | 2000133050 | 5/2000 |
| WO | WO 92/06402 | 4/1992 |

OTHER PUBLICATIONS

Masaki Shinbo, Epoxy Resin Handbook, issued by Nikkan Kogyo Shinbun Ltd., Dec. 25, 1987; pp. 368-371.

* cited by examiner

*Primary Examiner*—H Thi Le
(74) *Attorney, Agent, or Firm*—Kenyon & Kenyon LLP

(57) ABSTRACT

This invention provides a conductive fine particle having an ability of relaxing the force applied to a circuit of a substrate or the like. A conductive fine particle, comprising a core fine particle made of resin with its surface covered with at least one metal layer, wherein the resin has a coefficient of linear expansion of from $3 \times 10^{-5}$ to $7 \times 10^{-5}$ (1/K).

69 Claims, 1 Drawing Sheet

Figure 1:
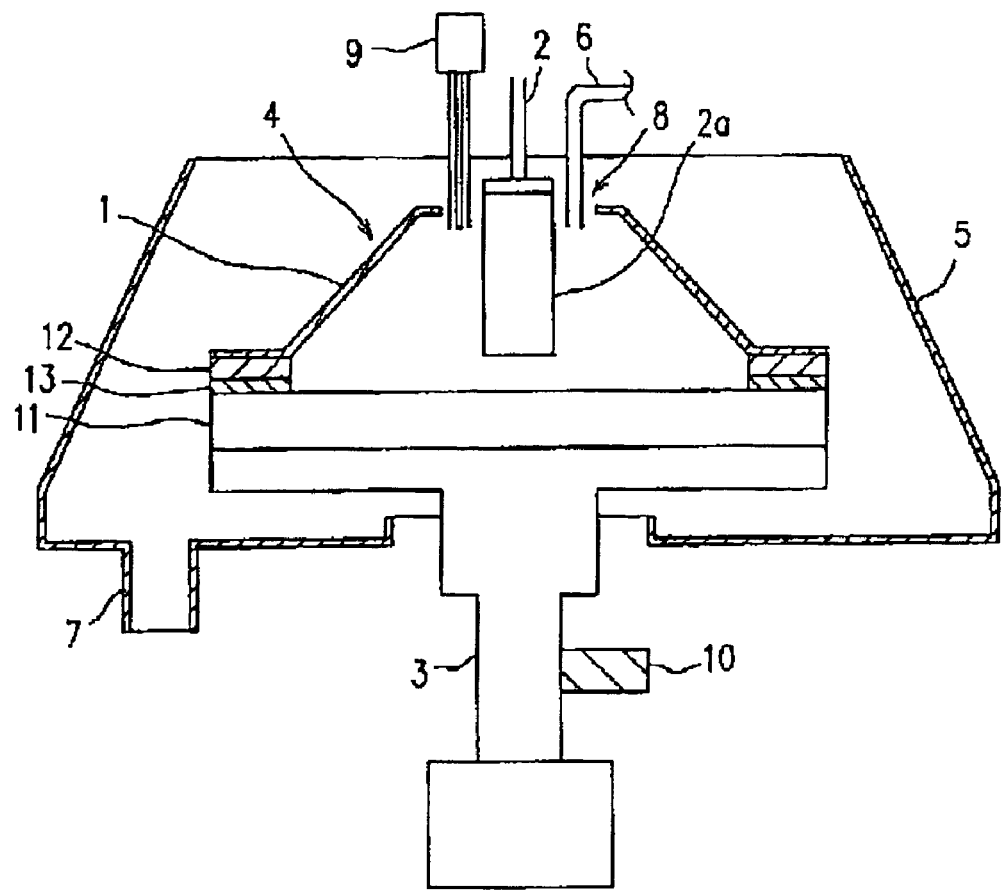

CONDUCTIVE FINE PARTICLES, METHOD FOR PLATING FINE PARTICLES, AND SUBSTRATE STRUCTURAL BODY

CROSS REFERENCE TO RELATED APPLICATION

This application is a national stage application of PCT/JP01/03743, filed on Apr. 27, 2001 and claiming priority of JP 2000-237185, filed on Aug. 4, 2000, JP 2000 255931, filed Aug. 25, 2000, JP 2000 255932, filed on Aug. 25, 2000, JP 2000 255933, filed on Aug. 25, 2000 and JP 2000 255934, filed on Aug. 25, 2000, the contents of which are incorporated herein by reference.

TECHNICAL FIELD

The present invention relates to conductive fine particles to be used for connecting two or more electrodes of an electric circuit, the conductive fine particles having an improved connection reliability resulting from relaxation of force applied to a circuit, and to substrate structures.

BACKGROUND ART

Heretofore, for connecting ICs or LSIs in an electric circuit substrate, a method has been used in which individual pins are soldered to a print wiring board. However, this method is of low production efficiency and is not suitable for densification.

In order to improve connection reliability, developed were technologies such as a BGA (ball grid array) in which substrates are connected with a so-called solder ball, which is a solder shaped into a spherical form. According to this technology, it was possible to produce an electric circuit while reconciling high productivity and high connection reliability by connecting a substrate, a chip and a solder ball mounted on the substrate while melting them at high temperature.

However, multilayering of substrates has advanced recently, which causes a problem that strain or expansion and contraction of a substrate itself is caused by change of the external environment and, as a result, application of such force to connections of substrates will cause breakage of wire. Moreover, the multilayering has made it difficult to maintain the distance between substrates; the fact that maintaining of that distance requires installation of spacers or the like and therefore much time and cost are needed has caused a problem.

As means for solving these problems, with respect to the relaxation of the force applied to circuits of substrates or the like, an attempt to reinforce substrate connections by application of a resin or the like has been made and this has exhibited a certain effect in improving a connection reliability. However, it has a problem that much labor is required and the cost increase is caused by addition of the application step. On the other hand, with respect to the maintenance of the distance between substrates, when balls in which copper is coated with solder are used, the copper, which does not melt like solder, serves as a support and makes it possible to maintain the distance between substrates. However, since copper is expensive and heavy, materials are awaited which are inexpensive and lightweight.

SUMMARY OF THE INVENTION

In light of the above present situations, the object of the present invention is to provide conductive fine particles having an ability of relaxing the force applied to a circuit of a substrate or the like, and a method for keeping the distance between substrates constant.

A first aspect of the present invention is a conductive fine particle, comprising a core fine particle made of resin with its surface covered with at least one metal layer, wherein the resin has a coefficient of linear expansion of from $3 \times 10^{-5}$ to $7 \times 10^{-5}$ (1/K).

A second aspect of the present invention is a conductive fine particle, comprising a core fine particle made of resin with its surface covered with at least one metal layer, wherein the resin has a thermal decomposition temperature of 300° C. or higher and at least one of the metal(s) constituting the metal layer is an alloy and/or a metal with a melting point of from 150 to 300° C.

A third aspect of the present invention is a conductive fine particle, comprising a core fine particle made of resin has a surface covered with at least one metal layer, wherein all of the metal layer respectively have a coefficient of thermal expansion of from $1 \times 10^{-5}$ to $3 \times 10^{-5}$ (1/K) and the ratio of the coefficient of thermal expansion of each metal layer to that of the core fine particle, namely coefficient of thermal expansion of core fine particle/coefficient of thermal expansion of metal layer, is from 0.1 to 10 respectively.

A fourth aspect of the present invention is a method for plating a fine particle, comprising covering the surface of a core fine particle with at least two kinds of metal alloy layers, wherein the metal alloy layer is a layer obtainable by depositing at least one kind of metal in electroplating and at least other one kind of metal can be formed by incorporation of a metal dispersed in a plating bath.

A fifth aspect of the present invention is a conductive fine particle, comprising a core fine particle with its surface covered with at least one metal layer, wherein at least one layer of the metal layer is an alloy layer obtainable by thermally diffusing two or more metal layers.

A sixth aspect of the present invention is a method for plating a fine particle, which comprises using a rotary plating device that comprises a rotatable dome equipped with a cathode on the periphery thereof and a filter through which a plating solution is allowed to pass to be discharged and an anode disposed in the dome at such a position as not to come into contact with the cathode in the dome and that repeats energizing and stirring while contacting the fine particle with the cathode by centrifugal force caused by rotation of the dome, and which comprises simultaneously adding the fine particle and a dummy particle having a hardness equal to that of the core fine particle to be plated and having a particle diameter as large as from 1.5 to 30 times that of the core fine particle to be plated.

BRIEF DESCRIPTION OF THE DRAWING(S)

FIG. 1 is a schematic view showing one example of a plating device to be used in the present invention.

Regarding the symbols in the drawing, 1 indicates a cover, 2 indicates an electrode, 2a indicates an anode, 3 indicates a rotation shaft, 5 indicates a container, 6 indicates a plating solution supply tube, 7 indicates a plating solution discharge tube, 8 indicates an opening, 11 indicates a bottom plate, 12 indicates a contact ring, and 13 indicates a porous ring.

DETAILED DISCLOSURE OF THE INVENTION

The present invention is described in detail below.

The first, second and third aspects of the present invention are directed to a conductive fine particle, comprising a core fine particle made of resin with its surface covered with at least one metal layer.

The resins used in the first aspect of the present invention have a coefficient of linear expansion of from $3 \times 10^{-5}$ to $7 \times 10^{-5}$ (1/K). The coefficient of linear expansion is measured by a compressive load method for from 60 to 280° C. If the coefficient of linear expansion is less than $7 \times 10^{-5}$, a stress relaxation effect will be reduced because the resin will become hard. If it exceeds $3 \times 10^{-5}$, a strain of a circuit can not be disregarded because a great deformation of the resin will occur. The conductive fine particle according to the first aspect of the present invention can keep the distance between substrates constant without being influenced by a temperature change because the resin used in the core fine particle has a coefficient of linear expansion within the above-mentioned range.

The resin used in the second aspect of the present invention has a thermal decomposition temperature of not lower than 300° C. The thermal decomposition temperature is measured by use of TGA (thermogravimetric analysis) and indicates a temperature at which loss of the weight of an object starts. If the thermal decomposition temperature is lower than 300° C., the conductive fine particle will be broken and it will become impossible to secure conduction, when the temperature of the substrates or the like is raised due to the conduction.

The resins to be used in the first, second and third aspect of the present invention are not particularly restricted when the resins meet above-mentioned condition, and are exemplified by crosslinked or non-crosslinked synthetic resins such as phenol resin, amino resin, acrylic resin, polyester resin, urea resin, melamine resin, alkyd resin, polyimide resin, urethane resin and epoxy resin; and organic-inorganic hybrid polymers. These may be used alone or in combination of two or more of them, for example, in the form of a copolymer.

The metal layers in the first, second and third aspects of the present invention are not particularly restricted, and are exemplified by those comprising at least one metal selected from the group consisting of gold, silver, copper, platinum, zinc, iron, lead, tin, aluminum, cobalt, indium, nickel, chromium, antimony, bismuth, germanium, cadmium, and silicon. The metal layers each may contain a single layer or two or more layers. The above-listed metals may be used alone or in combination of two or more of them. When two or more of the above-listed metals are used in combination, they may be used so as to form a structure containing a plurality of layers or used in the form of alloy.

In the second aspect of the present invention, at least one of the metals constituting the metal layer is an alloy and/or a metal having a melting point of from 150 to 300° C. If at least one of the metals constituting the metal layer is an alloy and/or a metal having a melting point of from 150 to 300° C., when the alloy and/or the metal is molten, strain or shrinkage of the substrates caused by temperature rise will be accommodated, resulting in relaxation of the force applied between the substrates. The alloy and/or the metal having a melting point of from 150 to 300° C. is not particularly restricted and, of the metal and alloys listed above, solder alloys, tin and the like fall within the category.

In the third aspect of the present invention, all the metal layers respectively have a coefficient of thermal expansion of from $1 \times 10^{-5}$ to $3 \times 10^{-5}$ (1/K) and the ratio of the coefficient of thermal expansion of each metal layer to that of the core fine particle, namely coefficient of thermal expansion of core fine particle/coefficient of thermal expansion of metal layer, is from 0.1 to 10 respectively. The conductive fine particle according to the third aspect of the present invention meets the above-mentioned conditions. Therefore, even if the temperature changes, expansion and shrinkage of the core fine particle will prevent the metal layer from breakage and also prevent peeling between the core fine particle and the metal layer, resulting in securing of the stability of connection.

In the conductive fine particles according to the first, second and third aspects of the present invention, the thickness of a metal layer is preferably from 0.5 to 30% of the radius of a core fine particle when the conductive fine particle has an outer diameter of from 200 to 1000 µm. If less than 0.5%, durability of a conductive fine particle during its conveyance or initial connection reliability may be deteriorated. If exceeding 30%, the stress relaxation effect may be deteriorated. If the thickness of a metal layer is within the above-mentioned range relative to the radius of a core fine particle, the stress relaxation effect of a conductive fine particle and durability of the particle itself becomes greatest.

Moreover, the thickness of a metal layer preferably satisfies the relationship relating to the radius of a core fine particle represented by equation (1) below:

$$Y = (-25/100,000 \cdot X + c) \times 100 \qquad (1)$$

wherein Y denotes the ratio (%) of the thickness of the metal layer to the radius of the core fine particle, X denotes the outer diameter (µm) of the conductive fine particle, and c denotes a constant of from 0.10 to 0.35, provided that Y>0.

If the above equation (1) is satisfied, the stress relaxation effect of the conductive fine particle and the durability of the particle itself will become greater.

In the conductive fine particles according to the first, second and third aspects of the present invention, the thickness of a metal layer is preferably from 1 to 100% of the radius of a core fine particle when the conductive fine particles have an outer diameter of from 50 to 200 µm. If less than 1%, durability of the particles during conveyance or initial connection reliability may be deteriorated. If exceeding 100%, the stress relaxation effect may be deteriorated. If the thickness of a metal layer is within the above-mentioned range relative to the radius of a core fine particle, the stress relaxation effect of a conductive fine particle and durability of the particle itself becomes greatest. More preferably, the thickness is from 4 to 40%.

It is preferable for the conductive fine particles according to the first, second and third aspects of the present invention that the number of the particles comprising a core fine particle containing a bubble is 1% or less of the total number of the particles. Since a particle comprising a core fine particle containing therein a bubble has unevenness in its surface, it is liable to peeling of a metal coating at the portion and will cause e.g. breakage of wire during substrate mounting. Furthermore, it will cause formation of microcracks in e.g. solder because the bubble expands during heating such as reflowing. Since a bubble will cause breakage of wire or microcracks, it is more desirable when the number of particles containing a bubble is smaller. When exceeding 1%, it is undesirable because the proportion defective will reach a level which can not be disregarded. More preferable is 0.5% or less.

Further, when the core fine particles in the conductive fine particles of the first, second and third aspects of the present invention have an outer diameter of from 50 to 1000 μm, it is desirable that the number of the particles containing a bubble with a diameter of 1% or more of the radius of the core fine particle is 1% or less of the total number of the particles.

When, like bubbles, a substance having a boiling point of not higher than 300° C. such as water is contained in a core fine particle, it will cause formation of microcracks in e.g. solder because the bubble expands during heating such as reflowing. For this reason, it is preferable for the conductive fine particles of the first, second and third aspects of the present invention that the sum of the substances with a boiling point of not higher than 300° C., such as water, contained in the core fine particle is 1% by weight or less of the total weight of the particle. When exceeding 1%, it is undesirable because the proportion defective will reach a level which can not be disregarded.

The conductive fine particles of the first, second and third aspects of the present invention preferably have a sphericity of not more than 1.5%. The sphericity is a parameter represented by equation (2) below:

$$\text{Sphericity (\%)}=(\text{Maximum diameter of sphere}-\text{Minimum diameter of sphere})/(\text{Maximum diameter of sphere}+\text{Minimum diameter of sphere})\times 2\times 100 \quad (2)$$

When the sphericity is 1.5% or less, the conductive fine particle is easy to handle and less damage will occur during its conveyance or during a step of its mounting. On the other hand, when the sphericity exceeds 1.5%, much damage will occur during its conveyance and pieces of the particle may be scattered during the step.

The conductive fine particles of the first, second and third aspects of the present invention preferably have a resistance of not higher than 100 mΩ. If not higher than 100 mΩ, no heat is generated in circuits and a module which consumes less electricity can be produced. If exceeding 100 mΩ, it is undesirable because the electricity consumption of a module using the conductive fine particle will rapidly increase and the resulting heat generation can not be disregarded.

It is preferable for the conductive fine particles of the first, second and third aspects of the present invention that a core fine particle have a ratio of the maximum value of E' to the minimum value of E' in the temperature range of from −60 to 200° C. of from 1 to 2. If the ratio of the maximum value to the minimum value in the aforementioned temperature range is from 1 to 2, a small change in viscoelasticity will occur and a small deterioration of products caused by heat will occur even if it is used for mounting. However, if exceeding a predetermined ratio, breakage or deterioration of products may occur when the viscoelasticity has decreased.

It is preferable for the conductive fine particles of the first, second and third aspects of the present invention that a core fine particle has a K value of from 1000 to 10000 (MPa). The K value (MPa) means a compressive hardness at the time of 10% deformation and is defined as $(3/\sqrt{2}) \cdot F \cdot S^{-3/2} \cdot R^{-1/2}$, wherein F denotes a value of load (MPa×mm$^2$) at 20° C. at 10% compressive deformation, S denotes a compressive displacement, and R is a value represented by a radius (mm). The K value is that calculated by compressing a conductive fine particle, in accordance with the disclosure of Japanese Kohyo Publication Hei-6-503180 with a smooth end surface of a cylinder 50 μm in diameter made of diamond by use of a micro compression tester (PCT-200 manufactured by Shimadzu Corporation) at a compressive hardness of 0.27 g/sec and at a maximum test load of 10 g. The smaller the K value, the easier the fine particle deforms. If the K value is smaller than 1000 MPa, it is too soft and therefore problems of e.g. cohesion during production may be caused. Furthermore, it is not practical because the gap between substrates is not maintained and collision may occur at positions other than the jointing portions between the substrates. If exceeding 10000 MPa, it is too hard and, when used for jointing substrates, a stress is easily applied to the jointed portions. More preferably it is from 1500 to 6500 (MPa).

It is preferable for the conductive fine particles of the first, second and third aspects of the present invention that the metal layer contains from two to four layers and the outermost layer thereof comprises a solder alloy and/or tin. The outer diameter of a core fine particle can be optionally selected according to applications. For example, it is possible to use core fine particles having an outer diameter of from 700 to 800 μm, from 250 to 400 μm, from 50 to 150 μm.

It is possible to absorb more effectively the strain or shrinkage of substrates caused by temperature rise and to relax the force applied to the substrates when using a conductive fine particle wherein the core fine particle has an outer diameter of from 700 to 800 μm, the metal layer contains four layers, the innermost layer being a nickel layer from 0.1 to 0.5 μm thick, the second innermost layer being a copper layer from 2 to 12 μm thick, the third innermost layer being a solder alloy layer from 2 to 30 μm thick comprising from 82 to 98% of lead and from 2 to 18% of tin and the outermost layer being a solder alloy layer from 2 to 30 μm thick comprising from 25 to 50% of lead and from 50 to 75% of tin.

The substrate structure comprising two or more substrates being connected by the conductive fine particle of the first, second and third aspects of the present invention is also one of the present invention.

It is preferable for the conductive fine particle used in the aforementioned substrate structure that the CV value of the particle diameter of a core fine particle is not more than 1.5%. The CV value used herein is that represented by equation (3) below:

$$CV \text{ value}=(\sigma/Dn)\times 100 \quad (3)$$

wherein σ denotes a standard deviation of the particle diameter and Dn denotes a number average particle diameter. The foregoing standard deviation and number average particle diameter are values obtained by an electron microscope observing and measuring 100 particles of arbitrary conductive fine particles. If the CV value exceeds 1.5%, the variation of particle diameter becomes large and, when electrodes are jointed through conductive fine particles, conductive fine particles not taking part in the jointing increase, which may result in a leak phenomenon between electrodes.

It is preferable for the conductive fine particle to be used in the aforementioned substrate structure that a core fine particle has a particle diameter within ±5% from the central value. If out of the range of ±5%, the variation of particle diameter also becomes large and, when electrodes are jointed through conductive fine particles, conductive fine particles not taking part in the jointing increase, which may result in a leak phenomenon between electrodes.

In the aforementioned substrate structure, it is preferable that the distance between substrates is from 95 to 120% of the particle diameter of the core fine particles in the conductive fine particles of the present invention. If less than 95%, the substrates may be damaged. If exceeding 120%, the connection stability may be deteriorated.

In the substrate structure, materials and/or compositions constituting two or more substrates may be the same or different. Even if a plurality of substrates constituting the substrate structure differ from each other, the force applied to a circuit of e.g. substrates caused by strain or expansion and contraction for change of the external environment of the substrates themselves can be relaxed by connecting by use of the conductive fine particles of the present invention.

In the aforementioned substrate structure, the difference between coefficients of linear expansion between the substrates may be 10 ppm or more. Even if 10 ppm or more, the force applied to a circuit e.g. of substrates caused by strain or expansion and contraction for change of the external environment of the substrates themselves can be relaxed by connecting by use of the conductive fine particles of the present invention.

The fourth aspect of the present invention is a method for plating a fine particle comprising covering the surface of a core fine particle with at least two kinds of metal alloy layers The metal alloy layer in the fourth aspect of the present invention is a layer obtainable by depositing at least one kind of metal in electroplating and at least other one kind of metal can be formed by incorporation of a metal dispersed in a plating bath.

The conductive fine particle to be obtainable by the fourth aspect of the present invention is a fine particle wherein the surface of a core fine particle made of resin and a metal ball is covered with at least two kinds of metal alloy layers. The aforementioned resin is exemplified by polystyrene, polystyrene copolymers, polyacrylic ester, polyacrylic ester polymers, phenol resin, polyester resin and polyvinyl chloride. They may be used alone or in combination of two or more of them. The core fine particle is not particularly restricted in its shape as long as it has a spherical form. For example, it may be in a hollow form. Examples of the metal ball include those of metal with a high melting point such as silver, copper, nickel, silicon, gold and titanium.

The core fine particle is not restricted in its average particle diameter, but, taking applications of mounted materials such as BGA and CSP into consideration, those with average particle diameters of from 1 to 1000 μm are useful and preferable.

The conductive fine particle of the present invention is that wherein the aforementioned core fine particle is covered with at least two kinds of metal alloy layers. Examples of the metal to be coated include gold, silver, copper, platinum, zinc, iron, tin, aluminum, cobalt, indium, nickel, chromium, titanium, antimony, bismuth, germanium, cadmium and silicon. These metals may be used alone or a plating layer may be formed in an alloy composition of at least two kinds of them. For example, a constitution is mentioned in which a nickel layer is plated on a core fine particle made of polystyrene resin and then a tin-silver alloy layer can be formed thereon.

Of these metal layers, at least one layer is preferably let be an alloy layer obtainable by plating by a composite plating method. In a composite plating layer, for complying with a recent demand for being free of lead, mentioned are plating compositions mainly consisting of tin, such as tin-silver, tin-copper, and tin-silver-copper. In particular, from the achievements in practical use and the conditions of a plating bath, preferred is tin-silver.

The thickness of the above-mentioned metal layer is not particularly restricted, but, taking applications such as conductive jointing and substrate jointing into consideration, it is preferably from 0.01 to 500 μm. If it is less than 0.01 μm, a desirable conductivity is difficult to be attained. If it exceeds 500 μm, particles may cohere together or the effect of maintaining the distance between substrates or of relaxing the force applied to a circuit such as a substrate may be reduced.

In the fourth aspect of the present invention, for example, use of a plating bath containing a divalent tin compound, a monovalent silver compound and a eutectoid stabilization aid as a basic composition makes it possible to electroplating the tin in the alloy composition as an ion and silver is solidified in a plated coating as metal silver dispersed in a plating bath.

In a plating bath, a metal silver particle can be formed naturally through a reaction of the following formula, which is a decomposition reaction.

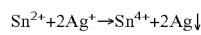

$$Sn^{2+}+2Ag^+ \rightarrow Sn^{4+}+2Ag\downarrow$$

The fact that the silver particle can be formed in a size as large as about 5 nm in particle diameter in a plating bath and exists with stability without causing aggregation or settlement has been confirmed.

In other words, the plating method of the present invention can solve all the conventional problems resulting from the fact that there is a considerable difference between the deposition potentials of tin and silver because the plating method of the present invention basically differs from conventional tin-silver alloy coating plating methods in which a tin ion and a silver ion are reduced simultaneously on a cathode to form an alloy. Accordingly, no drawback is caused in which silver, which is a noble component, is preferentially deposited at a low current density, resulting in an uneven alloy composition of a plated coating.

In addition, in the same principle, it is possible to control the coating composition at a low current density using the composite plating method even in an alloy composition with considerably different deposition potentials, such as tin-copper.

As the divalent tin compound to be used in the fourth aspect of the present invention, any ones other than known non-cyanides can be used. For example, organic acid salts and inorganic acid salts can be used, such as tin sulfate, tin chloride, tin bromide, tin oxide, tin borofluoride, tin silicofluoride, tin sulfamate, tin oxalate, tin tartarate, tin gluconate, tin pyrophosphate, tin methanesulfonate and tin alkanolsulfonate.

The amount of the tin compound used is appropriately from 5 to 100 g/L, preferably from 10 to 20 g/L, in terms of the amount of tin. The above-mentioned tin compounds may be used in combination of two or more of them.

The eutectoid stabilization aid to be used in the fourth aspect of the present invention is exemplified by the following ones:

(a) Aliphatic dicarboxylic acids having an alkyl group containing from 0 to 4 carbon atoms including oxalic acid, malonic acid, glutaric acid, adipic acid.

(b) Aliphatic oxycarboxylic acids including glycolic acid, lactic acid, malic acid, tartaric acid, citric acid, gluconic acid, glucoheptonic acid.

(c) Condensed phosphoric acids: pyrophosphoric acid and tripolyphosphoric acid.

(d) Amine carboxylic acids: ethylenediaminetetraacetic acid (EDTA), iminodiacetic acid, nitrilotriacetic acid, diethylenetriaminepentaacetic acid, and triethylenetetraminehexaacetic acid.

The amount of these eutectoid stabilization aids can be optionally selected depending upon the kinds of addition compounds to be used, but it is desirable to use them in an amount of 1 mol or more per mol of tin contained in a plating bath for holding the divalent tin compound stable in its aqueous solution. More preferred is from 2 to 5 mol. In addition, the above-mentioned compounds may be used in combination of two or more of them.

As the monovalent silver compound to be used in a plating bath in the fourth aspect of the present invention, any ones other than known non-cyanides can be used. For example, silver oxide, silver nitrate, silver sulfate, silver chloride, silver sulfamate, silver citrate, silver lactate, silver pyrophosphate, silver methanesulfonate, silver alkanolsulfonate and the like can be used.

The amount of these silver compounds to be used is preferably from 2 to 50 g/L, more preferably from 2 to 10 g/L and is preferably not more than ½ the amount of tin in molar number relative to the amount of the tin compound to be used. The above-mentioned compounds may be used in combination of two or more of them.

In order to control the silver content in a plated coating, an amine compound or a salt thereof having an action of increasing the amount of silver eutectically solidified in an acidic plating bath may be added to the plating bath of the fourth aspect of the present invention. As the amine compound, any known one can be used. Examples thereof include (mono, di, tri)methylamine, (mono, di, tri)ethylamine, (mono, di, tri)butylamine, ethylenediamine, triethyltetraamine, (mono, di, tri)ethanolamine, imidazole, oxine, bipyridyl, phenanthroline and succinimide. The addition amount thereof varies depending upon the kind of the compound used, but is preferably from 1 to 100 g/L, more preferably from 2 to 50 g/L. The above-mentioned compounds may be used in combination of two or more of them.

Moreover, as a surface regulator for imparting luster to the surface of a tin-silver alloy coating obtained by electrolysis from the plating bath of the fourth aspect of the present invention, for example, polyethylene glycol, polyoxyethylene alkylphenyl ether, polyoxyethylene alkyl ether, and polyoxyethylene fatty acid ester may be used.

As the polyethylene glycol, those with any molecular weight can be used. For example, those having an average molecular weight of from 200 to 4000000 can be used.

The amount thereof used is appropriately from 0.1 to 50 g/L, more preferably from 0.2 to 5 g/L. Further, at least one kind selected from polyoxyethylene alkylphenyl ether, polyoxyethylene alkyl ether and polyoxyethylene fatty acid ester can be used. These surface regulators are also used in a plating bath within the range of from 0.2 to 10 g/L.

The plating method of the fourth aspect of the present invention is not particularly restricted, but it is preferable, with respect to particles having a size of not larger than 500 μm, from the viewpoints of evenness and aggregation, to carry out plating using a rotary plating device that has a cathode on its periphery and that holds a plating solution and a plating core fine particle inside its main body and repeats turning on electricity and stirring while rotating (henceforth, referred to as a rotary plating device.).

A schematic view of one example of this rotary plating device is illustrated in FIG. 1. In the plating device A, a disk-like bottom plate 11 made of plastic, which is fixed to an upper end of a vertical driving shaft 3, is provided and a porous ring 13, as a filter through which only a treatment solution is allowed to pass, is arranged on the peripheral upper surface of the bottom plate 11. On the upper surface of porous ring 13, a contact ring 12 for charging with electricity is arranged as a cathode. A treatment chamber 4 is formed by sandwiching the porous ring 13 and the contact ring 12 between the bottom plate 11 and the periphery of a plastic hollow cover 1 with a truncated cone shape having an opening 8 in its upper center. The plating device A has a supply tube 6 through which a treatment solution or the like is supplied from the opening 8 to the treatment chamber 4, a plastic container 5 for receiving a treatment solution scattered from porous material windows, a discharge tube 7 from which a treatment solution accumulated in the container 5 is discharged, and an anode 2a which is inserted from the opening 8 to come into contact with the plating solution.

An electric current is allowed to pass between both electrodes, namely, contact ring 12 (cathode) and anode 2a, by making a plating solution and fine particles in which a conductive base layer has been formed exist in a treatment chamber 4 while causing the fine particles immersed in the plating solution and while rotating driving shaft 3. The fine particles are pressed against contact ring 12 through the action of centrifugal force and a plating layer is formed on a fine particle facing anode 2a. When driving shaft 3 stops, the fine particles are drawn by the action of a gravity and a flow caused by the inertia of the plating solution, thereby flowing down to a flat surface in the center of the bottom plate. The fine particles are pressed against contact ring 12 in another posture by the action of centrifugal force while being mixed. Accordingly, a plating layer is formed on another fine particle facing anode 2a. By repeating the rotation and stop of driving shaft 3, plating is applied uniformly to all the fine particles contained in treatment chamber 4.

The conductive fine particle obtainable by plating by the method for plating a fine particle of the fourth aspect of the present invention is also one of the present invention. When the above-mentioned conductive fine particle is used when electrodes are connected, it can relax force applied in a circuit and results in a good product as a conductive connection structure. Such a conductive connection structure is also one of the present invention.

The fifth aspect of the present invention is a conductive fine particle, comprising a core fine particle with its surface covered with at least one metal layer. The fifth aspect of the present invention is characterized in that at least one layer of the metal layer is an alloy layer obtainable by thermally diffusing two or more metal layers.

The above-mentioned core fine particle is not particularly restricted and is exemplified by those made of resin, metal or the like.

The aforementioned resin is exemplified by polystyrene, polystyrene copolymers, polyacrylic esters, polyacrylic ester polymers, phenol resin, polyester resin and polyvinyl chloride. They may be used alone or in combination of two or more of them. Examples of the aforementioned metal include metals with a high melting point such as silver, copper, nickel, silicon, gold and titanium.

As the aforementioned core fine particle, those made of resin are preferably used.

The aforementioned core fine particle is not particularly restricted in its shape as long as it has a spherical form. For example, it may have a hollow form.

The aforementioned core fine particle preferably has an average particle diameter of from 1 to 1000 μm. If it is less than 1 μm, the particle diameter of a conductive fine particle to be obtained is too small and therefore a good connection is hardly achieved when electrodes are connected. If it exceeds 1000 μm, it is difficult to meet with a recent demand for a narrow pitch connection.

Examples of the aforementioned metal layer include those made of gold, silver, copper, platinum, zinc, iron, tin, aluminum, cobalt, indium, nickel, chromium, titanium, antimony, bismuth, germanium, cadmium or silicon.

The thickness of the metal layer is not particularly restricted, but, taking applications such as conductive jointing and substrate jointing into consideration, it is preferably from 0.01 to 500 μm. If it is less than 0.01 μm, a desirable conductivity is difficult to be attained. If it exceeds 500 μm, particles may cohere together or the effect of maintaining the distance between substrates or of relaxing the force applied to a circuit such as a substrate may be reduced.

The method for forming a metal layer on the surface of the aforementioned core fine particle is not particularly restricted, and is exemplified by a method using electroless plating, a method using electroplating, a method comprising coating a fine particle with a metal fine powder alone or with a paste obtained by mixing the metal fine powder with a binder, or a physical vapor deposit such as vacuum evaporation, ion plating and ion sputtering.

The conductive fine particle of the fifth aspect of the present invention is characterized in that at least one of the aforementioned metal layer is an alloy layer obtainable by thermally diffusing two or more metal layers.

The aforementioned alloy layer is that to be obtainable by thermally diffusing at least two kinds of metal layers selected from the group consisting of tin, silver, copper, zinc, bismuth, indium, aluminum, cobalt, nickel, chromium, titanium, antimony, germanium, cadmium and silicon. In particular, preferred is an alloy layer obtainable by thermally diffusing a metal selected from silver, copper, zinc, bismuth and indium using tin as a base.

The method for thermally diffusing at least two kinds of metal layers is not particularly restricted. For example, a conductive fine particle having an alloy layer with a desired metal composition can be obtainable by carrying out plating by holding a fine particle with a multilayer structure for a certain period of time in a thermostatic oven. It is preferable to carry out thermal diffusion while making the inside of the thermostatic oven during the heat treatment be either an inert atmosphere such as nitrogen and argon or vacuum for inhibiting deterioration by oxidation caused by heat.

The heat treatment temperature is not particularly restricted and may be optionally selected depending upon the metal to diffuse, but it is preferable to carry out the heat treatment at a temperature approximately 20 to 100° C. lower than the melting point of the metal with a lower melting point. For example, when diffusing a multilayer structure of tin and silver, it is desirable to carry out thermal diffusion at a temperature approximately from 132 to 212° C., which is 20 to 100° C. lower than 232° C., which is the melting point of tin.

Since the aforementioned alloy layer is obtainable by thermally diffusing two or more metal layers, it is easy to control the metal composition of the alloy layer and it is possible to form an alloy layer with a desired metal composition.

The alloy layer is not particularly restricted with respect to its location, but it is preferably an outermost layer. By letting to be an outermost layer, it is possible to use that layer as a solder layer.

The conductive fine particle according to the fifth aspect of the present invention is used as a solder ball of a BGA, an anisotropic conductive sheet or an anisotropic conductive adhesive for jointing an IC, an LSI or the like onto a substrate and is used for jointing a substrate or a part.

The method for jointing the substrate or parts is not particularly restricted as long as a method of jointing by use of a conductive fine particle and is exemplified by the following methods.

(1) A method comprising placing, on a substrate or part with an electrode formed on the surface thereof, an anisotropic conductive sheet and subsequently a substrate or part with another electrode surface, followed by jointing by heating and pressuring.

(2) A method comprising jointing by supplying an anisotropic conductive adhesive with means such as screen printing or dispenser in place of the used of the anisotropic conductive sheet.

(3) A method comprising supplying a liquid binder into a gap between electrodes adhered through conductive fine particles and then jointing by solidifying the binder.

In the way described above, a jointed body of a substrate or part, namely a conductive connection structure, can be obtainable. Such a conductive connection structure is also one of the present invention.

The sixth aspect of the present invention a method for plating a fine particle which comprises using a rotary plating device that comprises a rotatable dome equipped with a cathode on the periphery thereof and a filter through which a plating solution is allowed to pass to be discharged and an anode disposed in the dome at such a position as not to come into contact with the cathode in the dome and that repeats energizing and stirring while contacting the fine particle with the cathode by centrifugal force caused by rotation of the dome. The method is characterized by carrying out plating by simultaneously adding a dummy particle that has a hardness as much as that of the core fine particle to be plated and has a particle diameter from 1.5 to 3.0 times as large as the core fine particle to be plated.

The conductive fine particle obtainable in the sixth aspect of the present invention is a core fine particle the surface of which is covered with at least one metal layer, the core fine particle comprising a resin and a metal ball. The composition of the core fine particle is not particularly restricted, but taking the function of imparting a stress relaxation function when being mounted into consideration, resin is preferred. The resin is exemplified by polystyrene, polystyrene copolymers, polyacrylic ester, polyacrylic ester polymers, phenol resin, polyester resin and polyvinyl chloride. They may be used alone or in combination of two or more of them. The core fine particle is not particularly restricted in its shape as long as it has a spherical form. For example, it may have a hollow form. Examples of the metal ball include those of metal with a high melting point such as silver, copper, nickel, silicon, gold and titanium.

The core fine particle is not restricted in its particle diameter, but, taking applications of mounted materials such as BGA and CSP into consideration, those with particle diameters of from 1 to 1000 μm are useful. Because of ease of aggregation in a rotary plating device, it is effective for particles with a size of from 1 to 500 μm.

The conductive fine particle obtainable in the sixth aspect of the present invention is that wherein the above-mentioned core fine particle is covered with at least one metal layer. Examples of the metal to be coated include gold, silver, copper, platinum, zinc, iron, tin, lead, aluminum, cobalt, indium, nickel, chromium, titanium, antimony, bismuth, germanium, cadmium and silicon. These metals may be used alone or a plating layer may be formed in an alloy composition of two kinds of them.

For example, a constitution is mentioned in which a nickel layer is plated on a core fine particle of polystyrene resin and then copper or tin is further plated thereon.

The thickness of the metal layer is not particularly restricted, but, taking applications such as conductive jointing and substrate jointing into consideration, it is preferably from 0.01 to 500 µm. If it is less than 0.01 µm, a desirable conductivity is difficult to be attained. If it exceeds 500 µm, particles may cohere together or the effect of maintaining the distance between substrates or of relaxing the force applied to a circuit such as a substrate may be reduced.

In the method for plating of a fine particle according to the sixth aspect of the present invention, used is a rotary plating device that comprises a rotatable dome equipped with a filter through which a plating solution is allowed to pass to be discharged and an anode disposed in the dome so that it does not come into contact with a cathode and that repeats energizing and stirring while contacting the fine particle with the cathode by centrifugal force caused by rotation of the dome. This is the same as that used in the fourth aspect of the present invention.

In the sixth aspect of the present invention, plating is carried out by simultaneously adding a dummy particle that has a hardness as much as that of the core fine particle to be plated and has a particle diameter from 1.5 to 3.0 times as large as the core fine particle to be plated.

The hardness of the dummy particle is defined using a compressive elasticity modulus and preferably is approximately from 200 to 500±100 kgf/mm$^2$.

It is preferable to use a dummy particle of a resin composition without using metals such as stainless steel and iron or inorganic substances such as zirconia and alumina. The resin composition is not particularly restricted and is exemplified by polystyrene, polystyrene copolymers, polyacrylic esters, polyacrylic ester copolymers, phenol resins, polyester resins, polyvinyl chloride and nylon. These may be used alone or in combination of two or more of them.

A preferable particle diameter of the dummy particle is approximately from 1.5 to 30 times that of the core fine particle to be plated.

A particle diameter of a dummy particle smaller than 1.5 times is undesirable because it becomes difficult to separate a particle plated from a dummy particle. That larger than 30 times is undesirable because core fine particles to be plated burrow into gaps between dummy particles to make it difficult to attain a substantial crumbling effect.

The fine particle plated by the method for a plating fine particle according to the sixth aspect of the present invention can be employed as a conductive particle to be used for connecting electrodes. Such a conductive particle is also one of the present invention. The aforementioned conductive fine particle can improve the reliability of connection through relaxation of the force applied in a circuit. A conductive connection structure in which the aforementioned conductive fine particle is used is also one of the present invention.

BEST MODE FOR CARRYING OUT THE INVENTION

The present invention will be described in more detail by way of examples, but the invention is not restricted only to these examples.

EXAMPLE 1

A nickel plating layer was formed as a conductive base layer onto a core fine particle obtained by copolymerizing styrene and benzene, thereby obtaining a nickel-plated fine particle having an average particle diameter of 698.5 µm and a standard deviation of 17.5 µm. 30 g of the resulting nickel-plated fine particle was weighed out and subjected to copper plating on the surface thereof using a barrel plating device, followed by eutectic solder plating thereon.

The plating barrel is a regular pentagonal prism shape 50 mm in diameter and 50 mm in height, which is provided to only one of its sides with a filter that is a mesh with an aperture size of 20 µm.

This device was charged with electricity in a copper plating solution for one hour to copper plate by rotating the container around an axis passing the centers of the regular pentagons at 50 rpm, and then washed. Subsequently, the plating barrel was rotated while charging with electricity in a eutectic solder plating solution for 8 hours, thereby eutectic solder plating.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 749.2 µm and the standard deviation was 18.1 µm. From a measurement of a section of the particle through a microscope, the Ni plating thickness, Cu plating thickness and eutectic solder plating thickness were, respectively, calculated to be about 0.3 µm, 5 µm and 20 µm. The coefficient of variation of particle diameter was 2.4%.

On the other hand, core fine particles before plating were formed into a board shape and then measured for the linear expansion rate for from 60 to 280° C. by a compression weighting method. The linear expansion rate was $6.0 \times 10^{-6}$ (1/K) for from 60 to 200° C. and $4.1 \times 10^{-5}$ (1/K) for from 200 to 280° C.

In addition, no scarring or bipolar was found in any of the plated particles.

COMPARATIVE EXAMPLE 1

A nickel plating layer was formed as a conductive base layer onto a core fine particle made of a polyurethane resin, thereby obtaining a nickel-plated fine particle having an average particle diameter of 704.5 µm and a standard deviation of 19.8 µm. 30 g of the resulting nickel-plated fine particle was weighed out and subjected to copper plating on the surface thereof in the same manner as Example 1, followed by eutectic solder plating thereon.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 755.5 µm and the standard deviation was 25.1 µm. From a measurement of a section of the particle through a microscope, the Ni plating thickness, Cu plating thickness and eutectic solder plating thickness were, respectively, calculated to be about 0.3 µm, 5 µm and 20 µm.

The coefficient of variation of particle diameter was 3.3%.

On the other hand, the linear expansion rate was measured for from 60 to 280° C. in the same manner as Example 1. The linear expansion rate was $13.5 \times 10^{-5}$ (1/K) for from 60 to 200° C. and $11.7 \times 10^{-5}$ (1/K) for from 200 to 280° C.

In addition, no scarring or bipolar was found in any of the plated particles.

EXAMPLE 2

A nickel plating layer was formed as a conductive base layer onto a core fine particle obtained by copolymerizing tetramethylolmethane tetraacrylate and divinylbenzene, thereby obtaining a nickel-plated fine particle having an average particle diameter of 748.2 µm and a standard deviation of 24.5 µm. 30 g of the resulting nickel-plated fine particle was weighed out and subjected to copper plating on the surface thereof in the same manner as Example 1, followed by eutectic solder plating thereon.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 800.5 µm and the standard deviation was 24.1 µm. From a measurement of a section of the particle through a microscope, the Ni plating thickness, Cu plating thickness and eutectic solder plating thickness were, respectively, calculated to be about 0.3 µm, 6 µm and 20 µm. The coefficient of variation of particle diameter was 3.0%.

On the other hand, the linear expansion rate was measured for from 60 to 280° C. in the same manner as Example 1. The linear expansion rate was $5.4 \times 10^{-5}$ (1/K) for from 60 to 200° C. and $3.7 \times 10^{-5}$ (1/K) for from 200 to 280° C.

In addition, no scarring or bipolar was found in any of the plated particles.

COMPARATIVE EXAMPLE 2

A nickel plating layer was formed as a conductive base layer onto a core fine particle made of an ethylene-vinyl acetate copolymer resin, thereby obtaining a nickel-plated fine particle having an average particle diameter of 748.5 µm and a standard deviation of 23.8 µm. 30 g of the resulting nickel-plated fine particle was weighed out and subjected to copper plating on the surface thereof in the same manner as Example 1, followed by eutectic solder plating thereon.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 800.7 µm and the standard deviation was 26.1 µm. From a measurement of a section of the particle through a microscope, the Ni plating thickness, Cu plating thickness and eutectic solder plating thickness were, respectively, calculated to be about 0.3 µm, 6 µm and 20 µm. The coefficient of variation of particle diameter was 3.3%.

On the other hand, the linear expansion rate was measured for from 60 to 280° C. in the same manner as Example 1. The linear expansion rate was $18.9 \times 10^{-5}$ (1/K) for from 60 to 200° C. and $15.4 \times 10^{-5}$ (1/K) for from 200 to 280° C.

In addition, no scarring or bipolar was found in any of the plated particles.

EXAMPLES 3 TO 5

A core fine particle the same as that of Example 2 was prepared except that it had an average particle diameter was 398.2 µm and a standard deviation of 5.8 µm. This was let be Example 3.

A core fine particle the same as that of Example 2 was prepared in the same manner as above except that it had an average particle diameter was 122.8 µm and a standard deviation of 1.6 µm. This was let be Example 4.

A core fine particle was prepared wherein the metal layer of Example 2 was changed to that comprising an innermost layer of Ni plating, the outer layer thereof of Cu plating, the outer layer thereof of a plating (high temperature solder) of an solder alloy of lead 9: tin 1, the outermost layer thereof of a eutectic solder plating and wherein the measurements of the individual layers in a section of the particle through a microscope were a Ni plating thickness of about 0.3 µm, a Cu plating thickness of 5 µm, a high temperature solder plating thickness of 10 µm and a eutectic solder plating thickness of 10 µm. This was let be Example 5.

COMPARATIVE EXAMPLES 3 TO 5

A core fine particle the same as that of Comparative Example 2 was prepared except that it had an average particle diameter was 401.2 µm and a standard deviation of 16.2 µm. This was let be Comparative Example 3.

A core fine particle the same as that of Comparative Example 2 was prepared in the same manner as above except that it had an average particle diameter was 135.3 µm and a standard deviation of 4.7 µm. This was let be Comparative Example 4.

A core fine particle was prepared wherein the metal layer of Comparative Example 2 was changed to that comprising an innermost layer of Ni plating, the outer layer thereof of Cu plating, the outer layer thereof of a plating (high temperature solder) of an solder alloy of lead 9: tin 1, the outermost layer thereof of a eutectic solder plating and wherein the measurements of the individual layers in a section of the particle through a microscope were a Ni plating thickness of about 0.3 µm, a Cu plating thickness of 5 µm, a high temperature solder plating thickness of 10 µm and a eutectic solder plating thickness of 10 µm. This was let be Comparative Example 5.

EXAMPLE 6

A nickel plating layer was formed as a conductive base layer onto a core fine particle obtained by copolymerizing tetramethylolmethane tetraacrylate and divinylbenzene, thereby obtaining a nickel-plated fine particle having an average particle diameter of 148.2 µm and a standard deviation of 4.5 µm. 30 g of the resulting nickel-plated fine particle was weighed out and subjected to copper plating on the surface thereof in the same manner as Example 1, followed by eutectic solder plating thereon.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 175.5 μm and the standard deviation was 6.1 μm. From a measurement of a section of the particle through a microscope, the Ni plating thickness, Cu plating thickness and eutectic solder plating thickness were, respectively, calculated to be about 0.3 μm, 3 μm and 10 μm. The coefficient of variation of particle diameter was 3.0%.

The presence of bubbles in the above-mentioned synthetic resin core fine particle was checked in advance. Bubbles not smaller than 1 μm were found in 15 particles of 10000 particles.

In addition, a core fine particle before plating was found to have a thermal decomposition temperature of 330° C. in the air through the measurement by TGA/TDA.

No scarring or bipolar was found in any of the plated particles.

COMPARATIVE EXAMPLE 6

A nickel plating layer was formed as a conductive base layer onto a core fine particle made of an ethylene-vinyl acetate copolymer resin, thereby obtaining a nickel-plated fine particle having an average particle diameter of 148.5 μm and a standard deviation of 3.8 μm. 30 g of the resulting nickel-plated fine particle was weighed out and subjected to copper plating on the surface thereof in the same manner as Example 1, followed by eutectic solder plating thereon.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 800.7 μm and the standard deviation was 26.1 μm. From a measurement of a section of the particle through a microscope, the Ni plating thickness, Cu plating thickness and eutectic solder plating thickness were, respectively, calculated to be about 0.3 μm, 1 μm and 2 μm. The coefficient of variation of particle diameter was 3.3%.

The presence of bubbles in the above-mentioned synthetic resin core fine particle was checked in advance. Bubbles not smaller than 1 μm were found in 63 particles of 10000 particles.

In addition, no scarring or bipolar was found in any of the plated particles.

EXAMPLE 7

A nickel plating layer was formed as a conductive base layer onto a core fine particle obtained by copolymerizing tetramethylolmethane tetraacrylate and divinylbenzene, thereby obtaining a nickel-plated fine particle having an average particle diameter of 748.2 μm and a standard deviation of 24.5 μm. 30 g of the resulting nickel-plated fine particle was weighed out and subjected to copper plating on the surface thereof in the same manner as Example 1, followed by eutectic solder plating thereon.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 800.5 μm and the standard deviation was 24.1 μm. From a measurement of a section of the particle through a microscope, the Ni plating thickness, Cu plating thickness and eutectic solder plating thickness were, respectively, calculated to be about 0.3 μm, 6 μm and 20 μm. The coefficient of variation of particle diameter was 3.0%.

E' (−60 to 200° C.) of the present invention was measured. The ratio of the maximum value to the minimum value was 1.78. The core fine particle had a resistance of 87 mΩ.

In this particle, the core fine particle had a thermal expansion rate of $9.8 \times 10^{-5}$ (1/K) and the metal layer had a thermal expansion rate of $1.68 \times 10^{-5}$ (1/K). The ratio of both thermal expansion rates was 5.83. Note that, the metal layer was measured with respect to copper.

In addition, no scarring or bipolar was found in any of the plated particles.

COMPARATIVE EXAMPLE 7

A nickel plating layer was formed as a conductive base layer onto a core fine particle made of an ethylene-vinyl acetate copolymer resin, thereby obtaining a nickel-plated fine particle having an average particle diameter of 748.5 μm and a standard deviation of 23.8 μm. 30 g of the resulting nickel-plated fine particle was weighed out and subjected to copper plating on the surface thereof in the same manner as Example 1, followed by eutectic solder plating thereon.

Observation of the thus obtained eutectic solder-plated resin fine particle the outermost shell of which is a eutectic solder plating layer through a microscope confirmed that no aggregation occurred and all the particles existed in the form of single particle. A hundred particles of the eutectic solder-plated resin fine particles were observed and measured through a magnifying glass to be found that the average particle diameter was 800.7 μm and the standard deviation was 26.1 μm. From a measurement of a section of the particle through a microscope, the Ni plating thickness, Cu plating thickness and eutectic solder plating thickness were, respectively, calculated to be about 0.3 μm, 6 μm and 20 μm. The coefficient of variation of particle diameter was 3.3%.

E' (−60 to 200° C.) of the present invention was measured. The ratio of the maximum value to the minimum value was 2.37. The core fine particle had a resistance of 137 mΩ.

In addition, no scarring or bipolar was found in any of the plated particles.

MEASUREMENT EXAMPLE

The plated particles, 4 types and 24 particles in total, of Examples 1 to 7 and Comparative Examples 1 to 10 were placed on a dummy chip, which was then jointed to a printed wiring board using an infrared reflow device. The jointing conditions were set to 185° C.—1 min and 245° C.—3 min. In such a way, a substrate was prepared to which ten dummy chips of each type were jointed. This was placed in a thermostatic oven which was programatically operated at −40 to 125° C. (30 minutes/cycle). All the spheres were checked for conduction at every 100 cycles. In Table 1, the relation between the number of cycles and the number of substrates whose conduction ceased is shown.

TABLE 1

| Number of cycle | 100 | 200 | 300 | 400 | 500 | 600 | 700 | 800 | 900 | 1000 |
|---|---|---|---|---|---|---|---|---|---|---|
| Example 1 | 0 | 0 | 0 | 0 | 0 | 0 | 0 | 1 | 1 | 4 |
| Example 2 | 0 | 0 | 0 | 0 | 0 | 0 | 0 | 0 | 1 | 5 |
| Example 3 | 0 | 0 | 0 | 0 | 0 | 0 | 1 | 2 | 4 | 4 |
| Example 4 | 0 | 0 | 0 | 1 | 2 | 4 | 4 | 6 | 6 | 8 |
| Example 5 | 0 | 0 | 0 | 2 | 3 | 5 | 6 | 8 | 8 | 10 |
| Example 6 | 0 | 0 | 0 | 1 | 2 | 3 | 3 | 5 | 7 | 10 |
| Example 7 | 0 | 0 | 0 | 0 | 0 | 0 | 0 | 0 | 1 | 2 |
| Comparative Example 1 | 0 | 0 | 0 | 1 | 1 | 2 | 4 | 5 | 8 | 10 |
| Comparative Example 2 | 0 | 0 | 0 | 0 | 2 | 2 | 3 | 3 | 5 | 6 |
| Comparative Example 3 | 0 | 0 | 1 | 1 | 2 | 3 | 3 | 3 | 5 | 8 |
| Comparative Example 4 | 0 | 1 | 1 | 3 | 3 | 6 | 6 | 8 | 8 | 10 |
| Comparative Example 5 | 0 | 1 | 2 | 4 | 5 | 8 | 8 | 9 | 9 | 10 |
| Comparative Example 6 | 0 | 1 | 3 | 5 | 5 | 5 | 7 | 7 | 10 | 10 |
| Comparative Example 7 | 0 | 0 | 1 | 1 | 2 | 2 | 3 | 4 | 6 | 8 |
| Comparative Example 8 | 0 | 9 | 10 | 10 | 10 | 10 | 10 | 10 | 10 | 10 |
| Comparative Example 9 | 0 | 7 | 9 | 10 | 10 | 10 | 10 | 10 | 10 | 10 |
| Comparative Example 10 | 0 | 5 | 9 | 9 | 10 | 10 | 10 | 10 | 10 | 10 |

As shown above, in Comparative Examples, samples in which conduction was lost at a relatively small number of cycles are much than in Examples. In particular, in Comparative Example 2, all the substrates lost their conduction at 200 cycles. It seems that great expansion of a sphere in a plated particle caused the breakage of a copper layer and a solder layer. Furthermore, in Comparative Example 1, all were broken at about 300 cycles.

EXAMPLE 8

In a separable flask, 1.3 part by weight of benzoyl peroxide as a polymerization initiator was mixed with 20 parts by weight of divinylbenzene homogeneously. After charging thereto of 20 parts by weight of a 3% aqueous polyvinyl alcohol solution and 0.5 part by weight of sodium dodecylsulfate and fully stirring, 140 parts by weight of ion exchange water was added. While stirring this solution, a reaction was carried out at 80° C. for 15 hours under nitrogen flow. The resulting fine particles were washed with hot water and acetone, and then subjected to particle sorting with a sieve, thereby obtaining particles having a central particle diameter of 710 μm. Onto this was formed a nickel plating layer as a conductive base layer.

Subsequently, the following was prepared as a plating solution. In 25 L of water, 537 g of tin sulfate ($SnSO_4$), 1652 g of potassium pyrophosphate ($K_4P_2O_7$) and 25 g of polyethylene glycol (molecular weight: 6000) were dissolved homogeneously. To this solution 42.5 g of silver nitrate ($AgNO_3$) was added and the solution was stirred for 2 hours.

The above-mentioned plating solution was placed in a bath of a rotary plating device and 40 g of the 710-μm nickel-plated particles were plated. The conditions during the plating were set to a bath temperature of 50° C., a current density of 0.5 A/dm², and a peripheral speed of 18 Hz. The direction of rotation was reversed at every 10 seconds.

The observation of the thus obtained plated particles through a microscope confirmed that no aggregation occurred and all the particles existed in the form of single particle. The appearance had silver white color and neither burned deposit nor mottle was found.

When the section of a particle was observed, the thickness of the outermost layer was 6 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=96.0:4.0, which was almost a tin/silver eutectic composition. When this particle was subjected to thermal analysis by DSC, a melting peak was found at 221° C., which is an alloy melting point of Sn/Ag.

EXAMPLE 9

Using divinylbenzene and 4-functional acrylic monomer, polymerization was conducted in the same manner as Example 8 and 710-μm particles were obtained as core fine particles. Subsequently, a plating treatment was carried out in the same manner as Example 8.

The observation of the thus obtained plated particles through a microscope confirmed that no aggregation occurred and all the particles existed in the form of single particle. The appearance had silver white color and neither burned deposit nor mottle was found.

When the section of a particle was observed, the thickness of the outermost layer was 6 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=96.0:4.0. When this particle was subjected to thermal analysis by DSC, a melting peak was found at 221° C., which is an alloy melting point of Sn/Ag.

EXAMPLE 10

Using, as core fine particles, copper balls with a particle diameter of 500 μm in place of resin particles, a tin-silver plating treatment was carried out with a rotary plating device in the same manner as Example 8.

The observation of the thus obtained plated particles through a microscope confirmed that no aggregation occurred and all the particles existed in the form of single particle. The appearance had silver white color and neither burned deposit nor mottle was found.

When the section of a particle was observed, the thickness of the outermost layer was 4 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=96.2:3.8. When this particle was subjected to thermal analysis by DSC, a melting peak was found at 218° C., which is an alloy melting point of Sn/Ag/Cu.

EXAMPLE 11

Core fine, particles were polymerized in the same manner as Example 8. Subsequently, particle sorting was carried out by use of a sieve, obtaining 310-μm particles. To these particles a plating treatment was applied in the same manner as Example 8.

The observation of the thus obtained plated particles through a microscope confirmed that no aggregation occurred and all the particles existed in the form of single particle. The appearance had silver white color and neither burned deposit nor mottle was found.

When the section of a particle was observed, the thickness of the outermost layer was 4 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=96.3:3.7. When this particle was subjected to thermal analysis by DSC, a melting peak was found at 221° C., which is an alloy melting point of Sn/Ag.

EXAMPLE 12

Core fine particles were polymerized in the same manner as Example 8. Subsequently, particle sorting was carried out by use of a sieve, obtaining 105-μm particles. To these particles a plating treatment was applied in the same manner as Example 8.

The observation of the thus obtained plated particles through a microscope confirmed that no aggregation occurred and all the particles existed in the form of single particle. The appearance had silver white color and neither burned deposit nor mottle was found.

When the section of a particle was observed, the thickness of the outermost layer was 4 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=96.3:3.7. When this particle was subjected to thermal analysis by DSC, a melting peak was found at 221° C., which is an alloy melting point of Sn/Ag.

EXAMPLE 13

Core fine particles were polymerized in the same manner as Example 8, obtaining 710-μm particles. The particles were electroless plated with nickel and copper as a conductive layer. Subsequently, a tin-silver plating treatment was carried out in the same manner as Example 8.

The observation of the thus obtained plated particles through a microscope confirmed that no aggregation occurred and all the particles existed in the form of single particle. The appearance had silver white color and neither burned deposit nor mottle was found.

When the section of a particle was observed, the thickness of the outermost layer was 4 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=96.2:3.8. When this particle was subjected to thermal analysis by DSC, a melting peak was found at 218° C., which is an alloy melting point of Sn/Ag/Cu.

EXAMPLE 14

Core fine particles were polymerized in the same manner as Example 8, obtaining 710-μm particles. The particles were electroless plated with nickel as a conductive layer.

The following was prepared as a plating solution. In 25 L of water, 537 g of tin sulfate ($SnSO_4$), 1652 g of potassium pyrophosphate ($K_4P_2O_7$), 25 g of polyethylene glycol (molecular weight: 6000) and 500 g of triethanolamine were dissolved homogeneously. To this solution 42.5 g of silver nitrate ($AgNO_3$) was added and the solution was stirred for 2 hours. Using the aforementioned plating solution, a tin-silver plating treatment was carried out under the same conditions as those in Example 8.

The observation of the thus obtained plated particles through a microscope confirmed that no aggregation occurred and all the particles existed in the form of single particle. The appearance had silver white color color and neither burned deposit nor mottle was found.

When the section of a particle was observed, the thickness of the outermost layer was 4 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=90.2:9.8. When this particle was subjected to thermal analysis by DSC, a melting peak was found at 221° C., which is an alloy melting point of Sn/Ag.

COMPARATIVE EXAMPLE 8

A nickel plating layer was formed as a conductive base layer on commercially available solder balls with a particle diameter of 800 μm.

Subsequently, the following was prepared as a plating solution.

In 20 L of water contained in a plating bath, added were 0.2 mol/L of tin methanesulfonate (($CH_3SO_3$)2Sn), 0.008 mol/L of silver methanesulfonate ($CH_3SO_3Ag$), 2 mol/L of methanesulfonic acid ($CH_3SO_3H$), 0.04 mol/L of L-cysteine, 0.002 mol/L of 2,2'-Dithiodianiline and 3 g/L of polyoxyethylene-α-naphtholol.

The above-mentioned plating solution was placed in a bath of a rotary plating device and 40 g of the 710-μm nickel-plated particles were plated. The conditions during the plating were set to a bath temperature of 25° C., a current density of 0.5 A/dm$^2$, and a peripheral speed of 18 Hz. The direction of rotation was reversed at every 10 seconds.

The observation of the thus obtained plated particles through a microscope confirmed that no aggregation occurred and all the particles existed in the form of single particle. The appearance had black color and mottle between particles was found.

When the section of a particle was observed, the thickness of the outermost layer was 6 μm. Composition analysis of the cut section by X-ray microwave analysis confirmed that an Sn layer exists on an Ni base layer and that Ag is dispersed in the Sn layer. When this plated coating was dissolved in a strong acid and the composition ratio was determined by atomic absorption analysis, the ratio was Sn:Ag=64.0:36.0 and a composition with an extremely high Ag content was obtained.

COMPARATIVE EXAMPLE 9

A nickel plating layer was formed as a conductive base layer on commercially available solder balls with a particle diameter of 400 µm.

Using a plating bath the same as that used in Example 8, tin-silver plating was carried out in a conventional barrel. The conditions during the plating were set to a bath temperature to 50° C., a current density to 0.5 A/dm$^2$, and rotational frequency of the barrel of 3 rpm.

When the barrel was rotated during the plating, boiling up of particles was observed. When the resulting plated particles were observed with a microscope, the appearance had a white color, but about 10% of the particles were observed to be bare particles with no plating.

When the section of a particle was observed, the thickness of the outermost layer was 4 µm. Composition analysis of the cut section by X-ray microwave analysis confirmed that an Sn layer exists on an Ni base layer and that Ag is dispersed in the Sn layer, but does not exist in the peripheral region. When this plated coating was dissolved in a strong acid and the composition ratio was determined by atomic absorption analysis, the ratio was Sn:Ag=99.0:1.0 and a composition with an extremely low Ag content was obtained

EXAMPLE 15

A nickel plating layer was formed as a conductive base layer onto a core fine particle obtained by copolymerizing styrene and divinylbenzene, thereby obtaining particles having an average particle diameter of 710.5 µm and a standard deviation of 32.5 µm. The resulting fine particles were plated with tin in the same manner as Example 1.

Observation of the thus obtained plated resin fine particle through a microscope confirmed that no aggregation occurred and all the particles existed in the form of single particle. A hundred particles of the particles were observed and measured through a magnifying glass to be found that the average particle diameter was 720 µm and the standard deviation was 18.1 µm.

The resulting particles were dispersed in a silver plating solution and substitution plated with silver by stirring at 50° C. for 30 minutes. Composition analysis of the cut section of a particle by X-ray microwave analysis confirmed a 3-layer structure of Ni, Sn and Ag. When this plated coating was dissolved in a strong acid and the composition ratio was determined by atomic absorption analysis, the ratio was Sn:Ag=96.0:4.0.

The particles are placed in a thermostatic oven and, after charging of nitrogen, the temperature was raised to 200° C., followed by a heat treatment for 12 hours. Composition analysis of the section of a heat treated particle by X-ray microwave analysis confirmed that an Ag layer and an Sn layer are diffused. When this particle was subjected to thermal analysis by DSC, a melting peak was found at 221° C., which is an alloy melting point of Sn/Ag.

EXAMPLE 16

Nickel plating was carried out in the same manner as Example 15, followed by copper plating with a barrel by charging with electricity for 1 hour in a copper plating solution. Subsequently, tin plating was carried out by barrel plating.

Composition analysis of the cut section of a particle by X-ray microwave analysis confirmed a 3-layer structure of Ni, Cu and Sn. When this plated coating was dissolved in a strong acid and the composition ratio was determined, the ratio was Sn:Cu=99.0:1.0.

The particles are placed in a thermostatic oven and, after charging of nitrogen, the temperature was raised to 200° C., followed by a heat treatment for 12 hours. Composition analysis of the section of a heat treated particle by X-ray microwave analysis confirmed that a Cu layer and an Sn layer are diffused. When this particle was subjected to thermal analysis by DSC, a melting peak was found at 227° C.

EXAMPLE 17

The nickel-copper-tin multilayer plated particles obtained in Example 16 was further subjected to silver substitution plating. Composition analysis of the cut section of a particle by X-ray microwave analysis confirmed a 4-layer structure of Ni, Cu, Sn and Ag. When this plated coating was dissolved in a strong acid and the composition ratio was determined, the ratio was Sn:Ag:Cu=95.0:4.0:1.0.

The particles are placed in a thermostatic oven and, after charging of nitrogen, the temperature was raised to 200° C., followed by a heat treatment for 12 hours. Composition analysis of the section of a heat treated particle by X-ray microwave analysis confirmed that a Cu layer, an Ag layer and an Sn layer are diffused. When this particle was subjected to thermal analysis by DSC, a melting peak was found at 217° C.

EXAMPLE 18

Nickel plating and tin plating were carried out in the same manner as Example 15. Subsequently, plating was carried out with bismuth using a barrel.

Composition analysis of the cut section of a particle by X-ray microwave analysis confirmed a 3-layer structure of Ni, Sn and Bi. When this plated coating was dissolved in a strong acid and the composition ratio was determined, the ratio was Sn:Bi=40:60.

The particles are placed in a thermostatic oven and, after charging of nitrogen, the temperature was raised to 180° C., followed by a heat treatment for 12 hours. Composition analysis of the section of a heat treated particle by X-ray microwave analysis confirmed that a Bi layer and an Sn layer are diffused. When this particle was subjected to thermal analysis by DSC, a melting peak was found at 139° C.

EXAMPLE 19

Nickel plating, tin plating and silver plating were carried out in the same manner as Example 15 except using core fine particles obtained by copolymerizing divinylbenzene and tetramethylolmethane tetramethacrylate.

Composition analysis of the cut section of a particle by X-ray microwave analysis confirmed a 3-layer structure of Ni, Sn and Ag. When this plated coating was dissolved in a strong acid and the composition ratio was determined, the ratio was Sn:Ag=96.0:4.0.

The particles are placed in a thermostatic oven and, after charging of nitrogen, the temperature was raised to 200° C., followed by a heat treatment for 12 hours. Composition analysis of the section of a heat treated particle by X-ray microwave analysis confirmed that an Ag layer and an Sn layer are diffused. When this particle was subjected to thermal analysis by DSC, a melting peak was found at 221° C., which is an alloy melting point of Sn/Ag.

EXAMPLE 20

Nickel plating, tin plating and silver plating were carried out in the same manner as Example 15 except using core fine particles obtained by copolymerizing divinylbenzene and polytetramethylene glycol diacrylate.

Composition analysis of the cut section of a particle by X-ray microwave analysis confirmed a 3-layer structure of Ni, Sn and Ag. When this plated coating was dissolved in a strong acid and the composition ratio was determined, the ratio was Sn:Ag=96.0:4.0.

The particles are placed in a thermostatic oven and, after charging of nitrogen, the temperature was raised to 200° C., followed by a heat treatment for 12 hours. Composition analysis of the section of a heat treated particle by X-ray microwave analysis confirmed that an Ag layer and an Sn layer are diffused. When this particle was subjected to thermal analysis by DSC, a melting peak was found at 221° C., which is an alloy melting point of Sn/Ag.

EXAMPLE 21

Nickel plating, tin plating and silver plating were carried out in the same manner as Example 15 using copper balls with a particle diameter of 500 μm as cores. Composition analysis of the cut section of a particle by X-ray microwave analysis confirmed a 3-layer structure of Ni, Sn and Ag. When this plated coating was dissolved in a strong acid and the composition ratio was determined, the ratio was Sn:Ag=96.0:4.0.

The particles are placed in a thermostatic oven and, after charging of nitrogen, the temperature was raised to 200° C., followed by a heat treatment for 12 hours. Composition analysis of the section of a heat treated particle by X-ray microwave analysis confirmed that an Ag layer and an Sn layer are diffused. When this particle was subjected to thermal analysis by DSC, a melting peak was found at 221° C., which is an alloy melting point of Sn/Ag.

EXAMPLE 22

Nickel plating, tin plating and silver plating were carried out in the same manner as Example 15 except using phenol resin core fine particles with a particle diameter of 400 μm.

Composition analysis of the cut section of a particle by X-ray microwave analysis confirmed a 3-layer structure of Ni, Sn and Ag. When this plated coating was dissolved in a strong acid and the composition ratio was determined, the ratio was Sn:Ag=96.0:4.0.

The particles are placed in a thermostatic oven and, after charging of nitrogen, the temperature was raised to 200° C., followed by a heat treatment for 12 hours. Composition analysis of the section of a heat treated particle by X-ray microwave analysis confirmed that an Ag layer and an Sn layer are diffused. When this particle was subjected to thermal analysis by DSC, a melting peak was found at 221° C., which is an alloy melting point of Sn/Ag.

COMPARATIVE EXAMPLE 10

Commercially available solder balls with a particle diameter of 150 μm were electroless nickel plated. The resulting particles were alloy plated in a bath containing tin and silver. Composition analysis of the cut section of a particle by X-ray microwave analysis confirmed an Sn/Ag alloy layer. When this plated coating was dissolved in a strong acid and the composition ratio was determined, the ratio was Sn:Ag=75:25 and a composition with an extremely high Ag content was obtained

COMPARATIVE EXAMPLE 11

Core fine particles the same as those used in Example 15 were electroless nickel plated. The resulting particles were alloy plated in a bath containing tin and copper. Composition analysis of the cut section of a particle by X-ray microwave analysis confirmed an Sn/Cu alloy layer. When this plated coating was dissolved in a strong acid and the composition ratio was determined, the ratio was Sn:Cu=80:20 and a composition with an extremely high Cu content was obtained

COMPARATIVE EXAMPLE 12

When the particles of nickel, tin and silver prepared in Example 15 were subjected to thermal analysis by DSC before heat treatment, observed was a melting peak at 232° C., which is a melting point of pure tin.

EXAMPLE 23

In a separable flask, 1.3 part by weight of benzoyl peroxide as a polymerization initiator was mixed with 20 parts by weight of divinylbenzene homogeneously. After charging thereto of 20 parts by weight of a 3% aqueous polyvinyl alcohol solution and 0.5 part by weight of sodium dodecylsulfate and fully stirring, 140 parts by weight of ion exchange water was added. While stirring this solution, a reaction was carried out at 80° C. for 15 hours under nitrogen flow. The resulting fine particles were washed with hot water and acetone, and then subjected to particle sorting with a sieve, thereby obtaining core fine particles having a central particle diameter of 300 μm. Onto this was formed a nickel plating layer as a conductive base layer by electroless plating. In the same way, nickel-plated dummy particles with a central particle diameter of 800 μm were prepared.

Subsequently, 40 g of the 300-μm nickel-plated particles and 20 mL of the 800-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 700 μm, thereby separating the 800-μm dummy particles and the plated particles. When the thus obtained plated particles were subjected to section observation, it was found that the thickness of their copper layer was 3 μm. Moreover, when the particles obtained were passed through a sieve with an aperture of 350 μm, the amount of those remaining on the sieve was not more than 1% of the whole weight and no large aggregation was recognized. Observation of 2000 particles of those particles through a microscope showed that the appearance had a lustrous copper color and particles with cracks or exfoliation accounted for about 2% of the whole.

EXAMPLE 24

Using divinylbenzene and 4-functional acrylic monomer, polymerization was conducted in the same manner as Example 23 and 300-μm particles were obtained as core fine particles. Onto this was formed a nickel plating layer as a conductive base layer by electroless plating. In the same way, obtained were nickel-plated dummy particles with a central particle diameter of 800 μm prepared from divinylbenzene and 4-functional acrylic monomer.

Subsequently, 40 g of the 300-μm nickel-plated particles and 20 mL of the 800-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 700 μm, thereby separating the 800-μm dummy particles and the plated particles. When the thus obtained plated particles were subjected to section observation, it was found that the thickness of their copper layer was 3 μm. Moreover, when the particles obtained were passed through a sieve with an aperture of 350 μm, the amount of those remaining on the sieve was not more than 1% of the whole weight and no large aggregation was recognized. Observation of 2000 particles of those particles through a microscope showed that the appearance had a lustrous copper color and particles with cracks or exfoliation accounted for about 2% of the whole.

EXAMPLE 25

Obtained in the same manner as Example 23 were 300-μm particles. Onto this was formed a nickel plating layer as a conductive base layer by electroless plating. In the same way, prepared were nickel-plated dummy particles with a central particle diameter of 2000 μm.

Subsequently, 40 g of the 300-μm nickel-plated particles and 30 mL of the 2000-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 1500 μm, thereby separating the 2000-μm dummy particles and the plated particles. When the thus obtained plated particles were subjected to section observation, it was found that the thickness of their copper layer was 3 μm. Moreover, when the particles obtained were passed through a sieve with an aperture of 350 μm, the amount of those remaining on the sieve was about 1% of the whole weight and no large aggregation was recognized. Observation of 2000 particles of those particles through a microscope showed that the appearance had a lustrous copper color and particles with cracks or exfoliation accounted for about 2% of the whole.

EXAMPLE 26

Obtained in the same manner as Example 23 were 300-μm particles. Onto this was formed a nickel plating layer as a conductive base layer by electroless plating. In the same way, prepared were nickel-plated dummy particles with a central particle diameter of 500 μm.

Subsequently, 40 g of the 300-μm nickel-plated particles and 20 mL of the 500-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 450 μm, thereby separating the 500-μm dummy particles and the plated particles. When the thus obtained plated particles were subjected to section observation, it was found that the thickness of their copper layer was 3 μm. Moreover, when the particles obtained were passed through a sieve with an aperture of 350 μm, the amount of those remaining on the sieve was not more than 1% of the whole weight and no large aggregation was recognized. Observation of 2000 particles of those particles through a microscope showed that the appearance had a lustrous copper color and particles with cracks or exfoliation accounted for about 2% of the whole.

EXAMPLE 27

Obtained in the same manner as Example 23 were 500-μm particles. Onto this was formed a nickel plating layer as a conductive base layer by electroless plating. In the same way, prepared were nickel-plated dummy particles with a central particle diameter of 800 μm.

Subsequently, 40 g of the 500-μm nickel-plated particles and 20 mL of the 800-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 700 μm, thereby separating the 800-μm dummy particles and the plated particles. When the thus obtained plated particles were subjected to section observation, it was found that the thickness of their copper layer was 2 μm. Moreover, when the particles obtained were passed through a sieve with an aperture of 450 μm, the amount of those remaining on the sieve was about 1% of the whole weight and no large aggregation was recognized. Observation of 2000 particles of those particles through a microscope showed that the appearance had a lustrous copper color and particles with cracks or exfoliation accounted for about 2% of the whole.

EXAMPLE 28

Obtained in the same manner as Example 23 were 100-μm particles. Onto this was formed a nickel plating layer as a conductive base layer by electroless plating. In the same way, prepared were nickel-plated dummy particles with a central particle diameter of 500 μm.

Subsequently, 40 g of the 100-μm nickel-plated particles and 20 mL of the 500-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 450 μm, thereby separating the 500-μm dummy particles and the plated particles. When the thus obtained plated particles were subjected to section observation, it was found that the thickness of their copper layer was 2 μm. Moreover, when the particles obtained were passed through a sieve with an aperture of 150 μm, the amount of those remaining on the sieve was about 1% of the whole weight and no large aggregation was recognized. Observation of 2000 particles of those particles through a microscope showed that the appearance had a lustrous copper color and particles with cracks or exfoliation accounted for about 1% of the whole.

EXAMPLE 29

Obtained in the same manner as Example 28 were 100-μm particles. Onto this was formed a nickel plating layer as a conductive base layer by electroless plating. In the same way, prepared were nickel-plated dummy particles with a central particle diameter of 2000 μm.

Subsequently, 40 g of the 100-μm nickel-plated particles and 30 mL of the 2000-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 1500 μm, thereby separating the 2000-μm dummy particles and the plated particles. When the thus obtained plated particles were subjected to section observation, it was found that the thickness of their copper layer was 2 μm. Moreover, when the particles obtained were passed through a sieve with an aperture of 150 μm, the amount of those remaining on the sieve was about 2% of the whole weight and no large aggregation was recognized. Observation of 2000 particles of those particles through a microscope showed that the appearance had a lustrous copper color and particles with cracks or exfoliation accounted for about 1% of the whole.

EXAMPLE 30

Obtained in the same manner as Example 23 were 50-μm particles. Onto this was formed a nickel plating layer as a conductive base layer by electroless plating. In the same way, prepared were nickel-plated dummy particles with a central particle diameter of 500 μm.

Subsequently, 40 g of the 50-μm nickel-plated particles and 30 mL of the 500-μm dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 450 μm, thereby separating the 500-μm dummy particles and the plated particles. When the thus obtained plated particles were subjected to section observation, it was found that the thickness of their copper layer was 2 μm. Moreover, when the particles obtained were passed through a sieve with an aperture of 100 μm, the amount of those remaining on the sieve was about 4% of the whole weight and no large aggregation was recognized. Observation of 2000 particles of those particles through a microscope showed that the appearance had a lustrous copper color and the number of particles with cracks or exfoliation was about 1% of the whole.

EXAMPLE 31

40 g of the 304-μm copper-plated particles obtained in Example 23 and 20 mL of the 800-μm nickel-plated dummy particles obtained in Example 23 were charged and eutectic solder plating was carried out. The conditions during the plating were set to a bath temperature of 30° C., a current density of 0.5 A/dm$^2$, and a peripheral speed of 18 Hz. The direction of rotation was reversed at every 40 seconds.

The particles obtained were passed through a sieve with an aperture of 700 μm, thereby separating the 800-μm dummy particles and the plated particles. When the thus obtained plated particles were subjected to section observation, it was found that the thickness of their eutectic solder layer was 6 μm. Moreover, when the particles obtained were passed through a sieve with an aperture of 350 μm, the amount of those remaining on the sieve was about 2% of the whole weight and no large aggregation was recognized. Observation of 2000 particles of those particles through a microscope showed that the appearance had a lustrous copper color and the number of particles with cracks or exfoliation was about 2% of the whole.

COMPARATIVE EXAMPLE 13

Obtained in the same manner as Example 23 were 300-μm particles. Onto this was formed a nickel plating layer as a conductive base layer by electroless plating. Subsequently, only 40 g of the 300-μm nickel-plated dummy particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

When the thus obtained plated particles were subjected to section observation, it was found that the thickness of their copper layer was 3 μm. Moreover, when the particles obtained were passed through a sieve with an aperture of 350 μm, the amount of those remaining on the sieve was about 10% of the whole weight and large aggregations about 2 mm cubic were recognized. Observation of 2000 particles of those particles through a microscope showed that the appearance had a lustrous copper color and particles with cracks or exfoliation accounted for about 1% of the whole.

COMPARATIVE EXAMPLE 14

Obtained in the same manner as Example 28 were 100-μm particles. Onto this was formed a nickel plating layer as a conductive base layer by electroless plating. Subsequently, only 40 g of the 100-μm nickel-plated particles were charged into a rotary plating device and copper plating was carried out. The conditions during the plating were set to a bath temperature of 30° C., a current density of 0.5 A/dm$^2$, and a peripheral speed of 18 Hz. The direction of rotation was reversed at every 40 seconds.

When the thus obtained plated particles were subjected to section observation, it was found that the thickness of their copper layer was 2 μm. Moreover, when the particles obtained were passed through a sieve with an aperture of 350 μm, the amount of those remaining on the sieve was about 20% of the whole weight and large aggregations about 5 mm cubic were recognized. Observation of 2000 particles of those particles through a microscope showed that the appearance had a lustrous copper color and particles with cracks or exfoliation accounted for about 1% of the whole.

COMPARATIVE EXAMPLE 15

Obtained in the same manner as Example 23 were 300-μm particles. Onto this was formed a nickel plating layer as a conductive base layer by electroless plating. Subsequently, 40 g of the 100-μm nickel-plated particles and 20 mL of zirconia ball dummy particles with a particle diameter of 1000 μm were charged into a rotary plating device and copper plating was carried out. The conditions during the plating were set to a bath temperature of 30° C., a current density of 0.5 A/dm², and a peripheral speed of 18 Hz. The direction of rotation was reversed at every 40 seconds.

The particles obtained were passed through a sieve with an aperture of 900 μm, thereby separating the 1000-μm dummy particles and the plated particles. When the thus obtained plated particles were subjected to section observation, it was found that the thickness of their copper layer was 3 μm. Moreover, when the particles obtained were passed through a sieve with an aperture of 350 μm, the amount of those remaining on the sieve was about 1% of the whole weight and no large aggregation was recognized. Observation of 2000 particles of those particles through a microscope showed that the appearance had a matte copper color and particles with cracks or exfoliation accounted for about 40% of the whole.

COMPARATIVE EXAMPLE 16

Obtained in the same manner as Example 23 were 300-μm particles. Onto this was formed a nickel plating layer as a conductive base layer by electroless plating. Subsequently, 40 g of the 300-μm nickel-plated particles and 20 mL of stainless steel ball dummy particles with a particle diameter of 1000 μm were charged into a rotary plating device and copper plating was carried out. The conditions during the plating were set to a bath temperature of 30° C., a current density of 0.5 A/dm², and a peripheral speed of 18 Hz. The direction of rotation was reversed at every 40 seconds.

The particles obtained were passed through a sieve with an aperture of 900 μm, thereby separating the 1000-μm dummy particles and the plated particles. When the thus obtained plated particles were subjected to section observation, it was found that the thickness of their copper layer was 3 μm. Moreover, when the particles obtained were passed through a sieve with an aperture of 350 μm, the amount of those remaining on the sieve was about 1% of the whole weight and no large aggregation was recognized. Observation of 2000 particles of those particles through a microscope showed that the appearance had a matte copper color and particles with cracks or exfoliation accounted for about 40% of the whole.

INDUSTRIAL APPLICABILITY

Since the present invention has the aforementioned constitution, it can provide means for jointing substrates or a substrate and a chip, the means being capable of holding continuity of substrates for a long period of time even under severe heat cycle conditions.

The invention claimed is:

1. An electrically conductive fine particle, comprising a core fine particle made of resin with its surface covered with at least two metal layers, wherein the resin has a coefficient of linear expansion of from $3 \times 10^{-5}$ to $7 \times 10^{-5}$ (1/k), wherein the core fine particle has an outer diameter of from 50 to 800 μm, the metal layers contain from two to four layers, and the outermost layer thereof comprises a solder alloy and/or tin.

2. The electrically conductive fine particle according to claim 1, wherein the resin has a thermal decomposition temperature of 300° C. or higher and at least one of the metal(s) constituting the metal layers is an alloy and/or a metal with a melting point of from 150 to 300° C.

3. The electrically conductive fine particle according to claim 1, wherein all of the metal layers respectively have a coefficient of thermal expansion of from $1 \times 10^{-5}$ to $3 \times 10^{-5}$ (1/K) and the ratio of the coefficient of thermal expansion of each of the metal layers to that of the core fine particle, namely coefficient of thermal expansion of core fine particle/coefficient of thermal expansion of metal layer, is from 0.1 to 10 respectively.

4. The electrically conductive fine particle according to claim 1, wherein each of the metal layers comprises at least one kind of metal selected from the group consisting of gold, silver, copper, platinum, zinc, iron, lead, tin, aluminum, cobalt, indium, nickel, chromium, antimony, bismuth, germanium, cadmium and silicon.

5. The electrically conductive fine particle according to claim 1, wherein the electrically conductive fine particle has an outer diameter of from 200 to 1000 μm and the total thickness of the metal layers is from 0.5 to 30% of the radius of the core fine particle.

6. The electrically conductive fine particle according to claim 1, wherein the electrically conductive fine particle has an outer diameter of from 200 to 1000 μm and the total thickness of the metal layers has a relation represented by formula (1) below with respect to the radius of the core fine particle;

$$Y = (-25/100,000 \cdot X + c) \times 100 \qquad (1)$$

where Y denotes the ratio (%) of the total thickness of the metal layers to the radius of the core fine particle, X denotes the outer diameter (μm) of the electrically conductive fine particle, and c denotes a constant of from 0.10 to 0.35, provided that Y>0.

7. The electrically conductive fine particle according to claim 1, wherein the electrically conductive fine particle has an outer diameter of from 50 to 200 μm and the total thickness of the metal layers is from 1 to 100% of the radius of the core fine particle.

8. The electrically conductive fine particle according to claim 1, wherein the electrically conductive fine particle has an outer diameter of from 50 to 200 μm and the total thickness of the metal layers is from 4 to 40% of the radius of the core fine particle.

9. The electrically conductive fine particle according to claim 1, wherein the number of the particles comprising a core fine particle and containing a bubble is 1% or less of the total number of the particles comprising the core fine particle.

10. The electrically conductive fine particle according to claim 9,
wherein the core fine particle has an outer diameter of from 50 to 1000 μm and the number of the particles containing a bubble with a diameter of 1% or more of the radius of the core fine particle is 1% or less of the total number of the particles comprising the core fine particle.

11. The electrically conductive fine particle according to claim 1,
wherein the sum of the substances with a boiling point of not higher than 300° C. contained in the core fine particle is 1% by weight or less of the total weight of the core fine particle.

12. The electrically conductive fine particle according to claim 1,
wherein the sum of the moisture contained in the core fine particle is 1% by weight or less of the total weight of the core fine particle.

13. The electrically conductive fine particle according to claim 1,
wherein the electrically conductive fine particle has a sphericity of 1.5% or less.

14. The electrically conductive fine particle according to claim 1,
wherein the electrically conductive fine particle has a resistance of 100 mΩ or less.

15. The electrically conductive fine particle according to claim 1,
wherein the ratio of the maximum value to the minimum value of the storage modulus E' of the core fine particle in the temperature range of from −60 to 200° C. is from 1 to 2.

16. The electrically conductive fine particle according to claim 1,
wherein the core fine particle has a K value of from 1000 to 10000 MPa.

17. The electrically conductive fine particle according to claim 1,
wherein at least one layer of the metal layers is an alloy layer obtained by thermally diffusing two or more metal layers.

18. The electrically conductive fine particle according to claim 17,
wherein the alloy layer is obtained by thermally diffusing at least two kinds of metal layers comprising metals selected from the group consisting of tin, silver, copper, zinc, bismuth, indium, aluminum, cobalt, nickel, chromium, titanium, antimony, germanium, cadmium and silicon.

19. A electrically conductive connection structure,
whose connection can be formed by the conductive fine particle according to claim 17.

20. The electrically conductive fine particle according to claim 1,
wherein the core fine particle has an outer diameter of from 700 to 800 μm, the metal layers contain from two to four layers, and the outermost layer thereof comprises a solder alloy and/or tin.

21. The electrically conductive fine particle according to claim 20,
wherein the core fine particle has an outer diameter of from 700 to 800 μm, and the metal layers contain four layers with the innermost layer being a nickel layer from 0.1 to 0.5 μm thick, the second innermost layer being a copper layer from 2 to 12 μm thick, the third innermost layer being a solder alloy layer from 2 to 30 μm thick comprising from 82 to 98% of lead and from 2 to 18% of tin, and the outermost layer being a solder alloy layer from 2 to 30 μm thick comprising from 25 to 50% of lead and from 50 to 75% of tin.

22. The electrically conductive fine particle according to claim 1,
wherein the core fine particle has an outer diameter of from 250 to 400 μm, the metal layers contain from two to four layers, and the outermost layer thereof comprises a solder alloy and/or tin.

23. The electrically conductive fine particle according to claim 1,
wherein the core fine particle has an outer diameter of from 50 to 150 μm, the metal layers contain from two to four layers, and the outermost layer thereof comprises a solder alloy and/or tin.

24. An electrically conductive fine particle, comprising a core fine particle made of resin with its surface covered with at least two metal layers,
wherein the resin has a thermal decomposition temperature of 300° C. or higher and
at least one of the metal(s) constituting the metal layers is an alloy and/or a metal with a melting point of from 150 to 300° C.,
wherein the core fine particle has an outer diameter of from 50 to 800 μm, the metal layers contain from two to four layers, and the outermost layer thereof comprises a solder alloy and/or tin.

25. The electrically conductive fine particle according to claim 24,
wherein the resin has a coefficient of linear expansion of from $3\times10^{-5}$ to $7\times10^{-5}$ (1/K).

26. The electrically conductive fine particle according to claim 24,
wherein all of the metal layers respectively have a coefficient of thermal expansion of from $1\times10^{-5}$ to $3\times10^{-5}$ (1/K) and
the ratio of the coefficient of thermal expansion of each of the metal layers to that of the core fine particle,
namely coefficient of thermal expansion of core fine particle/coefficient of thermal expansion of metal layer, is from 0.1 to 10 respectively.

27. The electrically conductive fine particle according to claim 24,
wherein each of the metal layers comprises at least one kind of metal selected from the group consisting of gold, silver, copper, platinum, zinc, iron, lead, tin, aluminum, cobalt, indium, nickel, chromium, antimony, bismuth, germanium, cadmium and silicon.

28. The electrically conductive fine particle according to claim 24,
wherein the electrically conductive fine particle has an outer diameter of from 200 to 1000 μm and the total thickness of the metal layers is from 0.5 to 30% of the radius of the core fine particle.

29. The electrically conductive fine particle according to claim 24,
wherein the electrically conductive fine particle has an outer diameter of from 200 to 1000 μm and the total thickness of the metal layers has a relation represented by formula (1) below with respect to the radius of the core fine particle;

$$Y=(-25/100{,}000\cdot X+c)\times 100 \qquad (1)$$

where Y denotes the ratio (%) of the total thickness of the metal layers to the radius of the core fine particle, X denotes the outer diameter (μm) of the electrically conductive fine particle, and c denotes a constant of from 0.10 to 0.35, provided that Y>0.

30. The electrically conductive fine particle according to claim 24,
wherein the electrically conductive fine particle has an outer diameter of from 50 to 200 μm and the total thickness of the metal layers is from 1 to 100% of the radius of the core fine particle.

31. The electrically conductive fine particle according to claim 24,
wherein the electrically conductive fine particle has an outer diameter of from 50 to 200 μm and the total thickness of the metal layers is from 4 to 40% of the radius of the core fine particle.

32. The electrically conductive fine particle according to claim 24,
wherein the number of the particles comprising a core fine particle and containing a bubble is 1% or less of the total number of the particles comprising the core fine particle.

33. The electrically conductive fine particle according to claim 32,
wherein the core fine particle has an outer diameter of from 50 to 1000 μm and the number of the particles containing a bubble with a diameter of 1% or more of the radius of the core fine particle is 1% or less of the total number of the particles comprising the core fine particles.

34. The electrically conductive fine particle according to claim 24,
wherein the sum of the substances with a boiling point of not higher than 300° C. contained in the core fine particle is 1% by weight or less of the total weight of the core fine particle.

35. The electrically conductive fine particle according to claim 24,
wherein the sum of the moisture contained in the core fine particle is 1% by weight or less of the total weight of the core fine particle.

36. The electrically conductive fine particle according to claim 24,
wherein the electrically conductive fine particle has a sphericity of 1.5% or less.

37. The electrically conductive fine particle according to claim 24,
wherein the electrically conductive fine particle has a resistance of 100 mΩ or less.

38. The electrically conductive fine particle according to claim 24,
wherein the ratio of the maximum value to the minimum value of the storage modulus E' of the core fine particle in the temperature range of from −60 to 200° C. is from 1 to 2.

39. The electrically conductive fine particle according to claim 24,
wherein the core fine particle has a K value of from 1000 to 10000 MPa.

40. The electrically conductive fine particle according to claim 24,
wherein at least one layer of the metal layers is an alloy layer obtained by thermally diffusing two or more metal layers.

41. The electrically conductive fine particle according to claim 40,
wherein the alloy layer is obtained by thermally diffusing at least two kinds of metal layers comprising metals selected from the group consisting of tin, silver, copper, zinc, bismuth, indium, aluminum, cobalt, nickel, chromium, titanium, antimony, germanium, cadmium and silicon.

42. A electrically conductive connection structure,
whose connection can be formed by the conductive fine particle according to claim 40.

43. The electrically conductive fine particle according to claim 24,
wherein the core fine particle has an outer diameter of from 700 to 800 μm, the metal layers contain from two to four layers, and the outermost layer thereof comprises a solder alloy and/or tin.

44. The electrically conductive fine particle according to claim 43,
wherein the core fine particle has an outer diameter of from 700 to 800 μm, and the metal layers contain four layers with the innermost layer being a nickel layer from 0.1 to 0.5 μm thick, the second innermost layer being a copper layer from 2 to 12 μm thick, the third innermost layer being a solder alloy layer from 2 to 30 μm thick comprising from 82 to 98% of lead and from 2 to 18% of tin, and the outermost layer being a solder alloy layer from 2 to 30 μm thick comprising from 25 to 50% of lead and from 50 to 75% of tin.

45. The electrically conductive fine particle according to claim 24,
wherein the core fine particle has an outer diameter of from 250 to 400 μm, the metal layers contain from two to four layers, and the outermost layer thereof comprises a solder alloy and/or tin.

46. The electrically conductive fine particle according to claim 24,
wherein the core fine particle has an outer diameter of from 50 to 150 μm, the metal layers contain from two to four layers, and the outermost layer thereof comprises a solder alloy and/or tin.

47. An electrically conductive fine particle, comprising a core fine particle with its surface covered with at least two metal layers,
wherein all of the metal layers respectively have a coefficient of thermal expansion of from $1\times10^{-5}$ to $3\times10^{-5}$ (1/K) and
the ratio of the coefficient of thermal expansion of each of the metal layers to that of the core fine particle,
namely coefficient of thermal expansion of core fine particle/coefficient of thermal expansion of metal layer, is from 0.1 to 10 respectively,
wherein the core fine particle has an outer diameter of from 50 to 800 μm, the metal layers contain from two to four layers, and the outermost layer thereof comprises a solder alloy and/or tin.

48. The electrically conductive fine particle according to claim 47,
wherein the core fine particle has an outer diameter of from 700 to 800 μm, the metal layers contain from two to four layers, and the outermost layer thereof comprises a solder alloy and/or tin.

49. The electrically conductive fine particle according to claim 48,
wherein the core fine particle has an outer diameter of from 700 to 800 μm, and the metal layers contain four layers with the innermost layer being a nickel layer from 0.1 to 0.5 μm thick, the second innermost layer being a copper layer from 2 to 12 μm thick, the third innermost layer being a solder alloy layer from 2 to 30 μm thick comprising from 82 to 98% of lead and from 2 to 18% of tin, and the outermost layer being a solder alloy layer from 2 to 30 μm thick comprising from 25 to 50% of lead and from 50 to 75% of tin.

50. The electrically conductive fine particle according to claim 47,
wherein the core fine particle has an outer diameter of from 250 to 400 μm, the metal layers contain from two to four layers, and the outermost layer thereof comprises a solder alloy and/or tin.

51. The electrically conductive fine particle according to claim 47,
wherein the core fine particle has an outer diameter of from 50 to 150 μm, the metal layers contain from two to four layers, and the outermost layer thereof comprises a solder alloy and/or tin.

52. The electrically conductive fine particle according to claim 47,
wherein at least one layer of the metal layers is an alloy layer obtained by thermally diffusing two or more metal layers.

53. The electrically conductive fine particle according to claim 52,
wherein the alloy layer is obtained by thermally diffusing at least two kinds of metal layers comprising metals selected from the group consisting of tin, silver, copper, zinc, bismuth, indium, aluminum, cobalt, nickel, chromium, titanium, antimony, germanium, cadmium and silicon.

54. An electrically conductive connection structure,
whose connection can be formed by the conductive fine particle according to claim 52.

55. The electrically conductive fine particle according to claim 47,
wherein the resin has a coefficient of linear expansion of from $3 \times 10^{-5}$ to $7 \times 10^{-5}$ (1/K).

56. The electrically conductive fine particle according to claim 47,
wherein the resin has a thermal decomposition temperature of 300° C. or higher and
at least one of the metal(s) constituting the metal layers is an alloy and/or a metal with a melting point of from 150 to 300° C.

57. The electrically conductive fine particle according to claim 47,
wherein each of the metal layers comprises at least one kind of metal selected from the group consisting of gold, silver, copper, platinum, zinc, iron, lead, tin, aluminum, cobalt, indium, nickel, chromium, antimony, bismuth, germanium, cadmium and silicon.

58. The electrically conductive fine particle according to claim 57,
wherein the electrically conductive fine particle has an outer diameter of from 200 to 1000 μm and the total thickness of the metal layers is from 0.5 to 30% of the radius of the core fine particle.

59. The electrically conductive fine particle according to claim 57,
wherein the electrically conductive fine particle has an outer diameter of from 200 to 1000 μm and the total thickness of the metal layers has a relation represented by formula (1) below with respect to the radius of the core fine particle;

$$Y = (-25/100{,}000 \cdot X + c) \times 100 \quad (1)$$

where Y denotes the ratio (%) of the total thickness of the metal layers to the radius of the core fine particle, X denotes the outer diameter (μm) of the electrically conductive fine particle, and c denotes a constant of from 0.10 to 0.35, provided that Y>0.

60. The electrically conductive fine particle according to claim 57,
wherein the electrically conductive fine particle has an outer diameter of from 50 to 200 μm and the total thickness of the metal layers is from 1 to 100% of the radius of the core fine particle.

61. The electrically conductive fine particle according to claim 57,
wherein the electrically conductive fine particle has an outer diameter of from 50 to 200 μm and the total thickness of the metal layers is from 4 to 40% of the radius of the core fine particle.

62. The electrically conductive fine particle according to claim 61,
wherein the number of the particles comprising a core fine particle and containing a bubble is 1% or less of the total number of the particles comprising the core fine particle.

63. The electrically conductive fine particle according to claim 62,
wherein the core fine particle has an outer diameter of from 50 to 1000 μm and the number of the particles containing a bubble with a diameter of 1% or more of the radius of the core fine particle is 1% or less of the total number of the particles comprising the core fine particle.

64. The electrically conductive fine particle according to claim 63,
wherein the sum of the substances with a boiling point of not higher than 300° C. contained in the core fine particle is 1% by weight or less of the total weight of the core fine particle.

65. The electrically conductive fine particle according to claim 64,
wherein the sum of the moisture contained in the core fine particle is 1% by weight or less of the total weight of the core fine particle.

66. The electrically conductive fine particle according to claim 65,
wherein the electrically conductive fine particle has a sphericity of 1.5% or less.

67. The electrically conductive fine particle according to claim 65,
wherein the electrically conductive fine particle has a resistance of 100 mΩ or less.

68. The electrically conductive fine particle according to claim 65,
wherein the ratio of the maximum value to the minimum value of the storage modulus E' of the core fine particle in the temperature range of from −60 to 200° C. is from 1 to 2.

69. The electrically conductive fine particle according to claim 68,
wherein the core fine particle has a K value of from 1000 to 10000 MPa.

* * * * *